(12) United States Patent
Murakami

(10) Patent No.: US 12,167,644 B2
(45) Date of Patent: Dec. 10, 2024

(54) DISPLAY DEVICE INCLUDING ANISOTROPIC CONDUCTIVE FILM (ACF)

(71) Applicant: SHARP KABUSHIKI KAISHA, Sakai (JP)

(72) Inventor: Shinzoh Murakami, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 572 days.

(21) Appl. No.: 17/436,650

(22) PCT Filed: Mar. 20, 2019

(86) PCT No.: PCT/JP2019/011802
§ 371 (c)(1),
(2) Date: Sep. 6, 2021

(87) PCT Pub. No.: WO2020/188807
PCT Pub. Date: Sep. 24, 2020

(65) Prior Publication Data
US 2022/0190075 A1    Jun. 16, 2022

(51) Int. Cl.
*H10K 59/12* (2023.01)
*H01L 25/18* (2023.01)
(Continued)

(52) U.S. Cl.
CPC ........... *H10K 59/124* (2023.02); *H01L 25/18* (2013.01); *H10K 59/122* (2023.02); *H10K 71/00* (2023.02);
(Continued)

(58) Field of Classification Search
CPC .. H10K 59/124; H10K 59/122; H10K 59/131; H10K 59/12; H10K 59/352;
(Continued)

(56) References Cited

U.S. PATENT DOCUMENTS 6,356,333 B1 * 3/2002 Uchiyama ............... H05K 3/323
349/149
8,698,000 B2 * 4/2014 Moriwaki ............. G02F 1/1345
174/250
(Continued)

FOREIGN PATENT DOCUMENTS

JP    2003-223112 A    8/2003
JP    2017-219844 A    12/2017
(Continued)

*Primary Examiner* — Ida M Soward
(74) *Attorney, Agent, or Firm* — ScienBiziP, P.C.

(57) ABSTRACT

A terminal connection portion, which includes an IC including a plurality of input bumps and a plurality of output bumps, and a terminal connection portion including a plurality of input terminal electrodes and a plurality of output terminal electrodes, is provided in a frame region, and in the terminal connection portion, an electrode insulating film is provided on the input terminal electrodes and the output terminal electrodes. A protruding portion is provided on the electrode insulating film, and the protruding portion overlaps with the IC in a plan view, and overlaps with the input bumps and the output bumps when viewed from a direction parallel to a substrate surface of a resin substrate layer.

20 Claims, 17 Drawing Sheets

(51) Int. Cl.
*H10K 59/122* (2023.01)
*H10K 59/124* (2023.01)
*H10K 71/00* (2023.01)
*H01L 23/00* (2006.01)
*H10K 50/15* (2023.01)
*H10K 50/16* (2023.01)
*H10K 50/17* (2023.01)
*H10K 50/844* (2023.01)
*H10K 59/121* (2023.01)
*H10K 59/131* (2023.01)
*H10K 59/35* (2023.01)
*H10K 77/10* (2023.01)
*H10K 102/00* (2023.01)

(52) U.S. Cl.
CPC .............. *H01L 24/06* (2013.01); *H01L 24/14* (2013.01); *H01L 24/16* (2013.01); *H01L 24/32* (2013.01); *H01L 24/73* (2013.01); *H01L 2224/0603* (2013.01); *H01L 2224/06131* (2013.01); *H01L 2224/06133* (2013.01); *H01L 2224/06177* (2013.01); *H01L 2224/1403* (2013.01); *H01L 2224/14131* (2013.01); *H01L 2224/14133* (2013.01); *H01L 2224/14177* (2013.01); *H01L 2224/16145* (2013.01); *H01L 2224/32145* (2013.01); *H01L 2224/73204* (2013.01); *H10K 50/15* (2023.02); *H10K 50/16* (2023.02); *H10K 50/17* (2023.02); *H10K 50/171* (2023.02); *H10K 50/844* (2023.02); *H10K 59/12* (2023.02); *H10K 59/1201* (2023.02); *H10K 59/1216* (2023.02); *H10K 59/131* (2023.02); *H10K 59/352* (2023.02); *H10K 77/111* (2023.02); *H10K 2102/311* (2023.02)

(58) Field of Classification Search
CPC .. H10K 59/1216; H10K 50/844; H10K 50/15; H10K 50/16; H10K 50/17; H10K 50/171; H10K 77/111; H10K 2102/311; H01L 25/18; H01L 25/0753; H01L 25/167; H01L 24/06; H01L 24/14; H01L 24/16; H01L 24/32; H01L 24/29; H01L 24/83; H01L 24/05; H01L 24/81; H01L 33/62; H01L 2224/0603; H01L 2224/06131; H01L 2224/06133; H01L 2224/06177; H01L 2224/1403; H01L 2224/14131; H01L 2224/14133; H01L 2224/14177; H01L 2224/16145; H01L 2224/32145; H01L 2224/73204; H01L 2224/0401; H01L 2224/05099; H01L 2224/05552; H01L 2224/05553; H01L 2224/05555; H01L 2224/05558; H01L 2224/05567; H01L 2224/05569; H01L 2224/05686; H01L 2224/06135; H01L 2224/13099; H01L 2224/14135; H01L 2224/26165; H01L 2224/2929; H01L 2224/293; H01L 2224/32105; H01L 2224/32106; H01L 2924/12041; H01L 2924/12044; H01L 2924/14; G09F 9/00; G09F 9/30; H05B 33/06

See application file for complete search history.

(56) References Cited

U.S. PATENT DOCUMENTS

| | | | |
|---|---|---|---|
| 8,780,310 B2* | 7/2014 | Moriwaki | G02F 1/136204 348/149 |
| 9,595,544 B2* | 3/2017 | Chikama | H01L 27/1244 |
| 10,037,947 B1* | 7/2018 | Tischler | H01L 33/505 |
| 2010/0141888 A1* | 6/2010 | Kim | H05K 3/361 349/152 |
| 2011/0315956 A1* | 12/2011 | Tischler | H01L 33/36 257/E33.048 |
| 2015/0163911 A1* | 6/2015 | Lee | H10K 71/00 29/831 |
| 2016/0211279 A1 | 7/2016 | Her | |
| 2017/0352834 A1* | 12/2017 | Kim | G02F 1/133305 |
| 2020/0358030 A1 | 11/2020 | Okabe et al. | |

FOREIGN PATENT DOCUMENTS

| | | |
|---|---|---|
| JP | 2019-036426 A | 3/2019 |
| KR | 10-2013-0053280 A | 5/2013 |
| WO | 2019/038884 A1 | 2/2019 |

* cited by examiner

DISPLAY DEVICE INCLUDING ANISOTROPIC CONDUCTIVE FILM (ACF)

TECHNICAL FIELD

The disclosure relates to a display device.

BACKGROUND ART

In recent years, a self-luminous type organic electroluminescence (EL) display device using an organic EL element has attracted attention as a display device that can replace a liquid crystal display device. As the organic EL display device, a flexible organic EL display device has been proposed that has a structure in which an organic EL element, various films, and the like are directly formed on a flexible resin substrate (hereinafter also referred to as a "flexible substrate"), and on which a drive integrated circuit (IC) is directly mounted.

For example, PTL 1 discloses a display device that includes, on a substrate, an image display unit and a drive IC for driving a plurality of electrodes configuring the image display unit, in order to eliminate time and effort to apply a protective coating on an exposed portion of a metal wiring line after carrying out an operation of connecting the drive IC to the metal wiring line. The display drive shares a fixing member for fixing the drive IC to be in a connected state with the metal wiring line on at least the image display unit side, with a protective cover covering the metal wiring line.

CITATION LIST

Patent Literature

PTL 1: JP 2003-223112 A

SUMMARY

Technical Problem

However, in a flexible organic EL display device, when an IC is compression-bonded to a flexible substrate via an anisotropic conductive film (ACF), due to heat and a load applied at the time of the bonding, a problem sometimes arises by which the flexible substrate becomes warped.

The disclosure has been made in light of the above-described point, and an object of the disclosure is to reduce warping of a flexible substrate when compression-bonding an IC.

Solution to Problem

In order to achieve the object described above, a display device according to the disclosure includes a display region provided with a plurality of pixels and a plurality of pixel circuits, and a frame region provided surrounding the display region. The display device includes a flexible substrate, a thin film transistor layer provided on the flexible substrate and provided with a plurality of thin film transistors, a plurality of light-emitting elements provided on the thin film transistor layer and including a plurality of first electrodes, a plurality of function layers, and a second electrode, and a sealing layer provided to cover the plurality of light-emitting elements. The frame region is provided with an electronic component including a plurality of input bumps to which signals are input and a plurality of output bumps from which signals are output, and a terminal connection portion including a plurality of input terminal electrodes respectively electrically connected to the plurality of input bumps via an anisotropic conductive film and a plurality of output terminal electrodes respectively electrically connected to the plurality of output bumps. An electrode insulating film is provided, in the terminal connection portion, on the plurality of input terminal electrodes and the plurality of output terminal electrodes. The electrode insulating film is provided with an input electrode opening configured to expose the plurality of input terminal electrodes and an output electrode opening configured to expose the plurality of output terminal electrodes. A protruding portion is provided on the electrode insulating film. The protruding portion overlaps with the electronic component in a plan view, and overlaps with the plurality of input bumps and the plurality of output bumps when viewed from a direction parallel to a substrate surface of the flexible substrate.

Advantageous Effects

According to the disclosure, a protruding portion is provided on an electrode insulating film provided on input terminal electrodes and output terminal electrodes, and since this protruding portion overlaps with an electronic component (an IC) in a plan view and overlaps with input bumps and output bumps when viewed from a direction parallel to a substrate surface of a flexible substrate, warping of the flexible substrate is reduced when the IC is compression-bonded.

DESCRIPTION OF EMBODIMENTS

Embodiments of the disclosure will be described below in detail with reference to the drawings. Note that the disclosure is not limited to each of the embodiments described below.

First Embodiment

Figure 1:
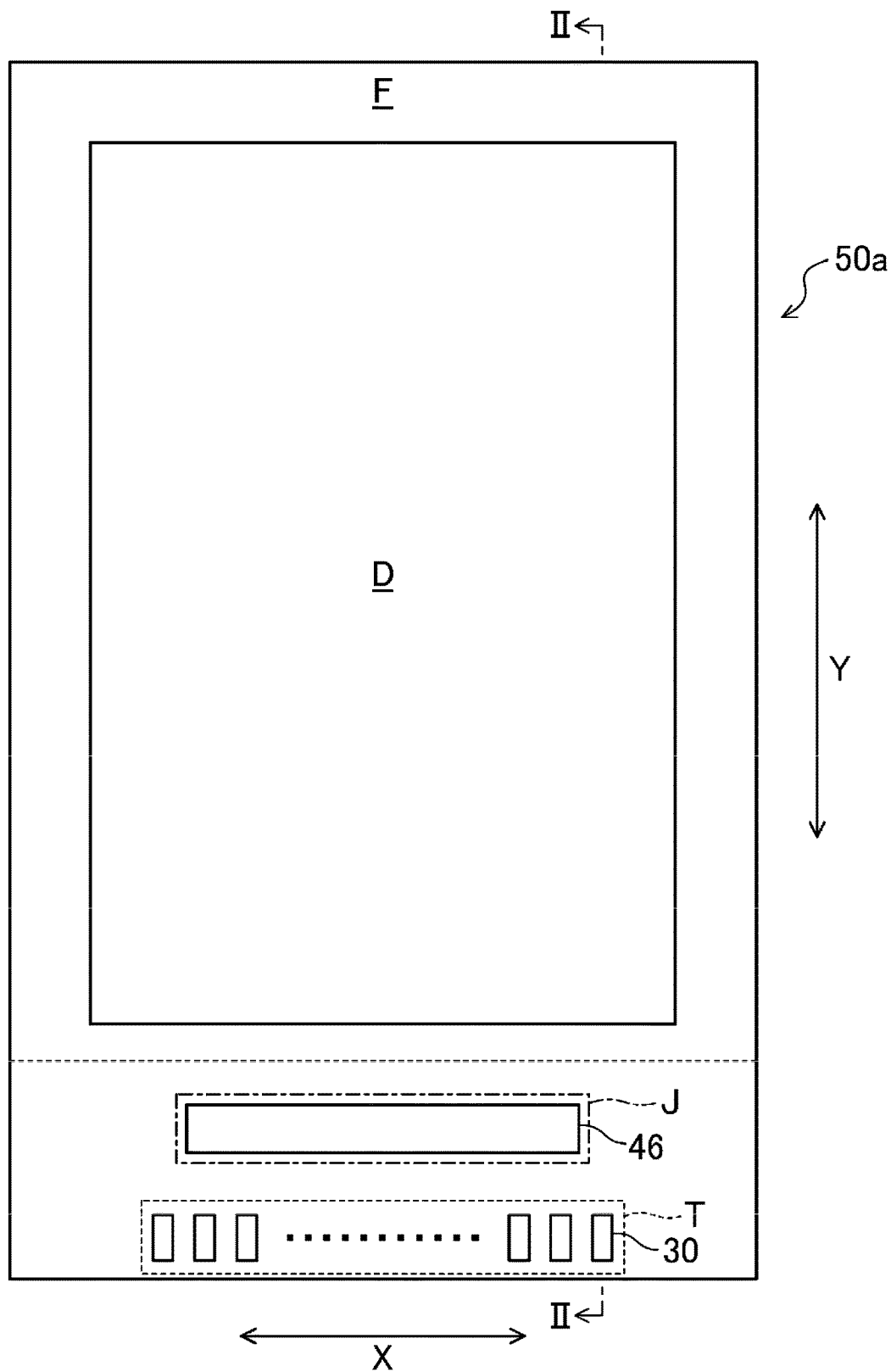
FIG. 1 is a plan view illustrating a schematic configuration of an organic EL display device according to a first embodiment of the disclosure.
Figure 2:
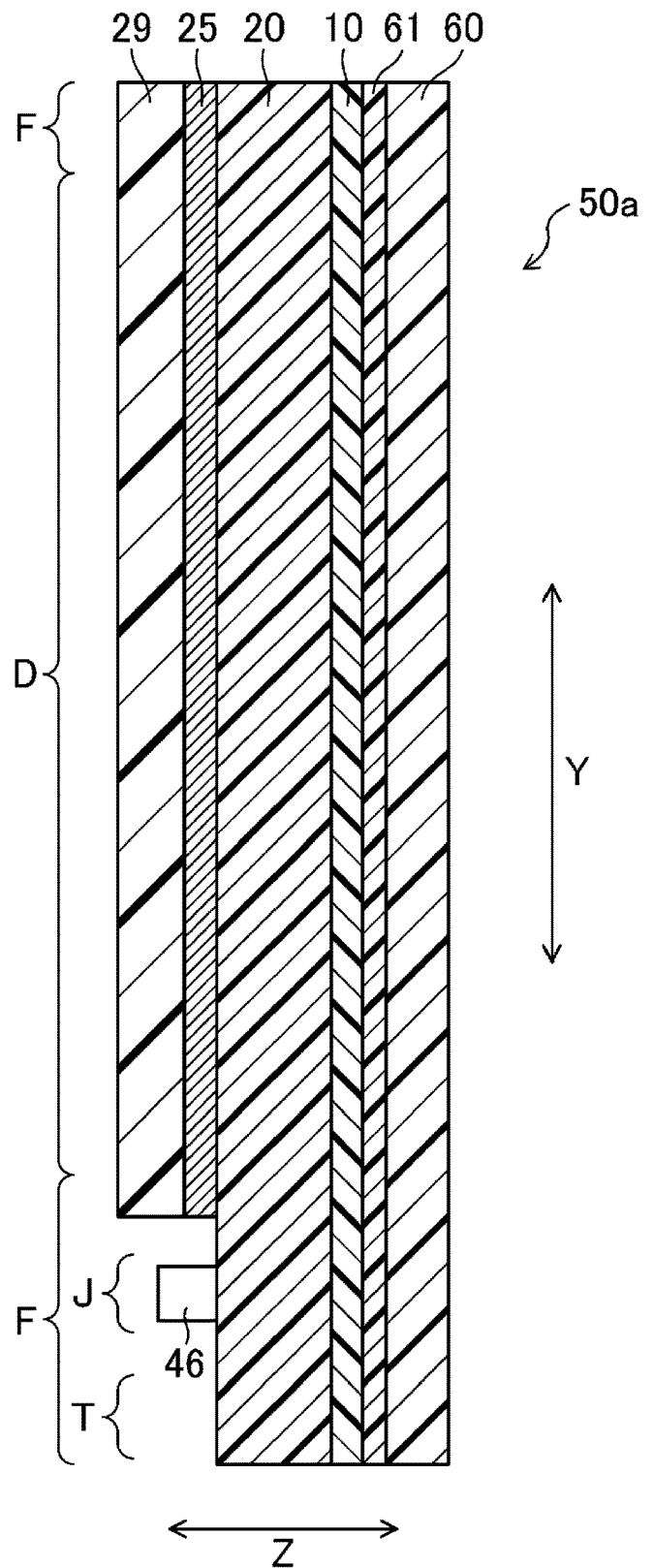
FIG. 2 is a side view illustrating a schematic configuration of the organic EL display device according to the first embodiment of the disclosure.
Figure 3:
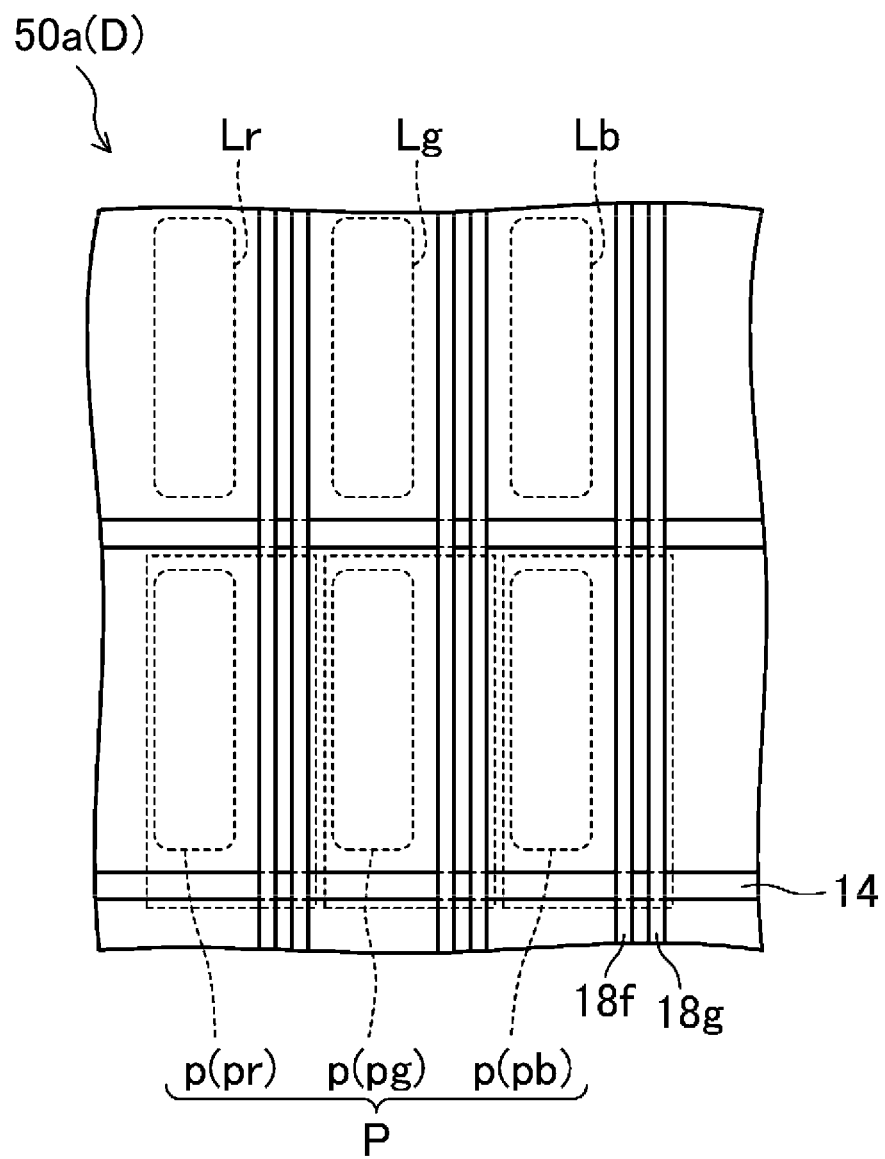
FIG. 3 is a cross-sectional view of a display region of the organic EL display device according to the first embodiment of the disclosure.
Figure 4:
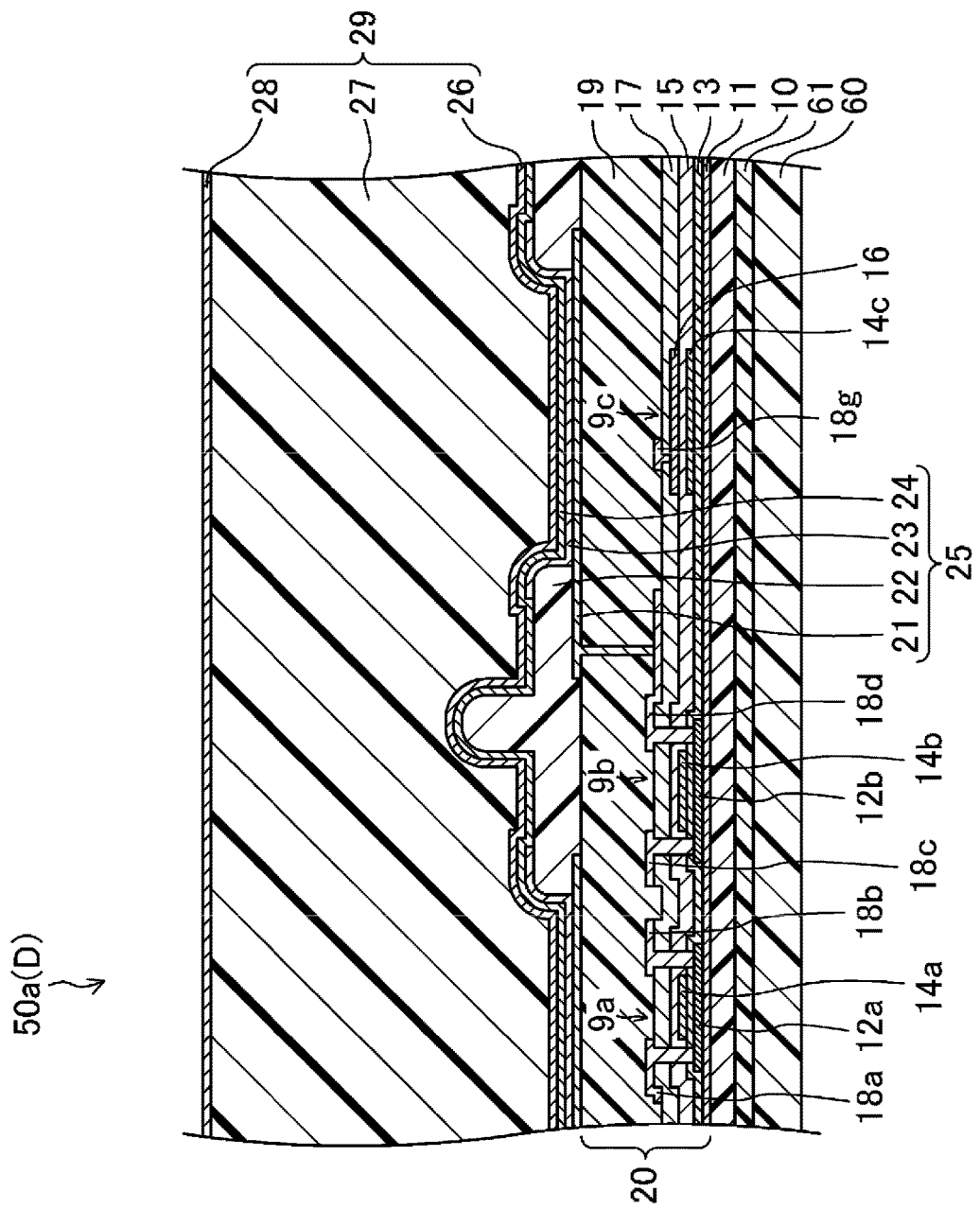
FIG. 4 is a cross-sectional view of the display region of the organic EL display device according to the first embodiment of the disclosure.
Figure 5:
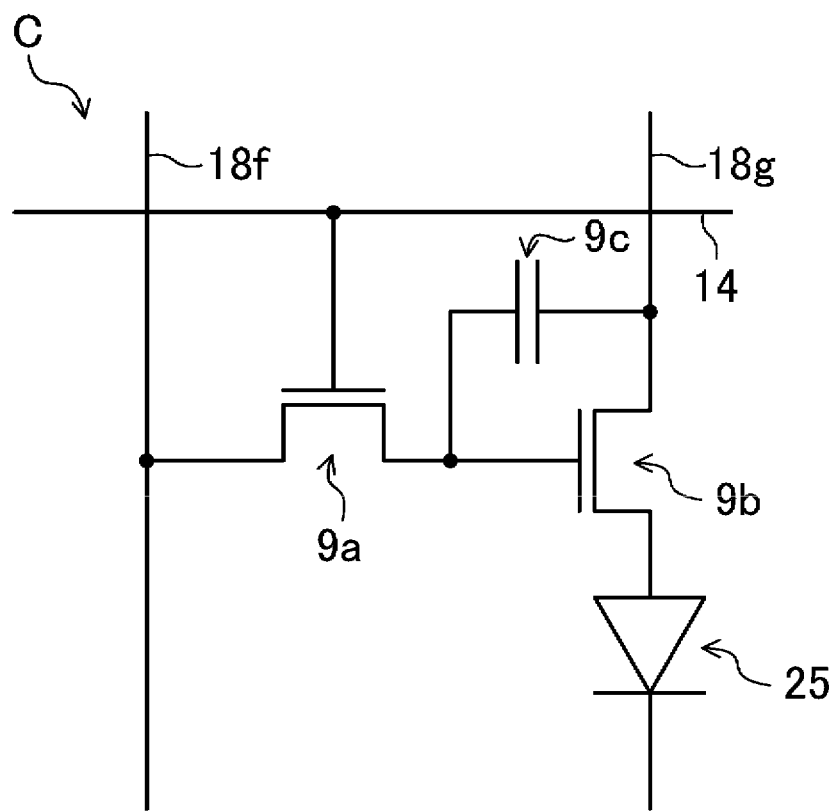
FIG. 5 is an equivalent circuit diagram illustrating a pixel circuit of the organic EL display device according to the first embodiment of the disclosure.
Figure 6:
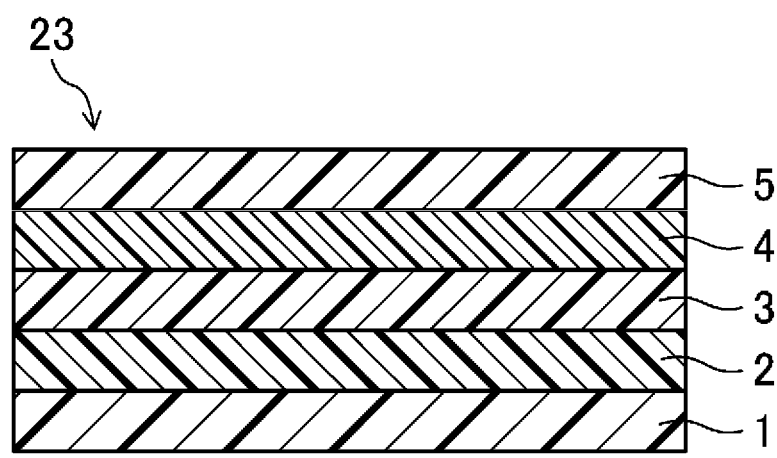
FIG. 6 is a cross-sectional view of an organic EL layer configuring the organic EL display device according to the first embodiment of the disclosure.
Figure 7:
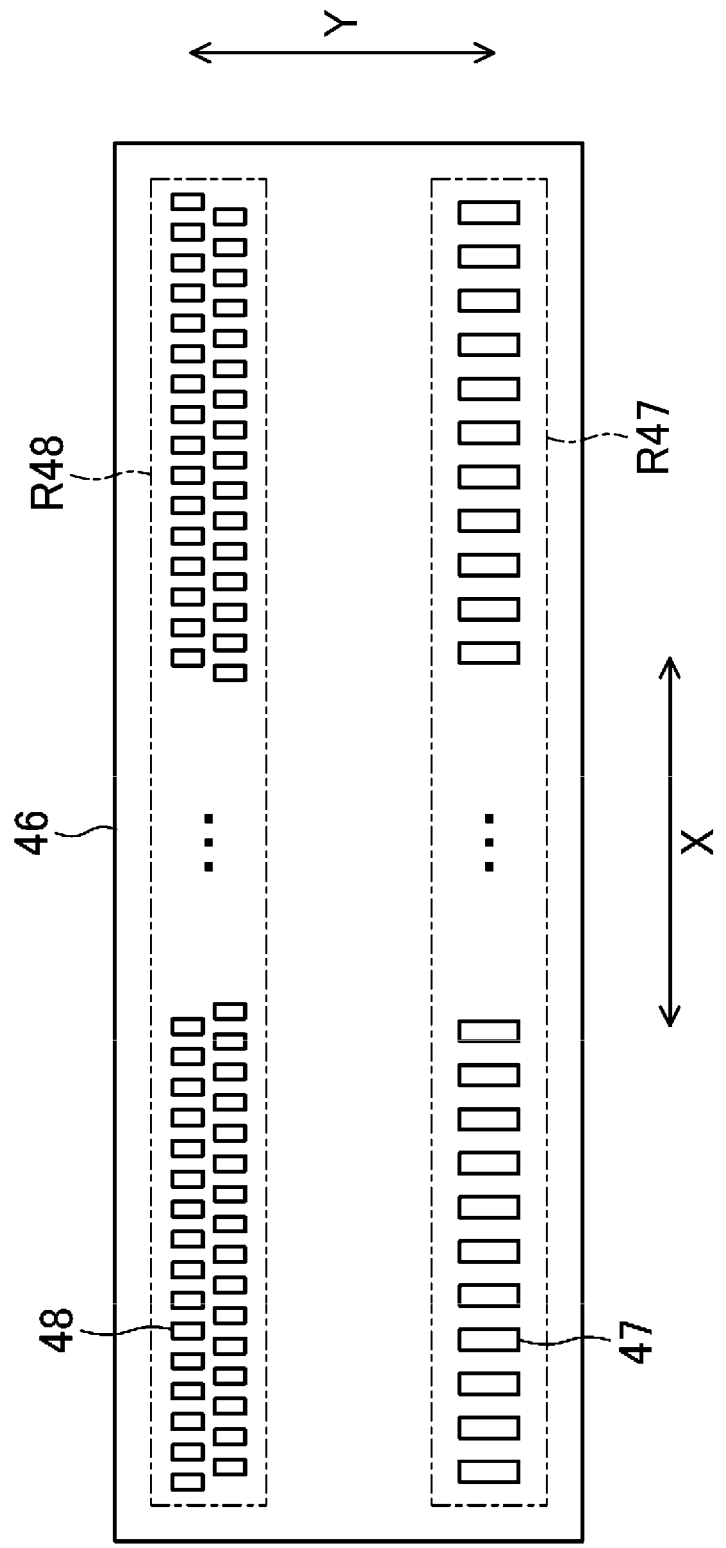
FIG. 7 is a bottom view of an IC configuring the organic EL display device according to the first embodiment of the disclosure.
Figure 8:
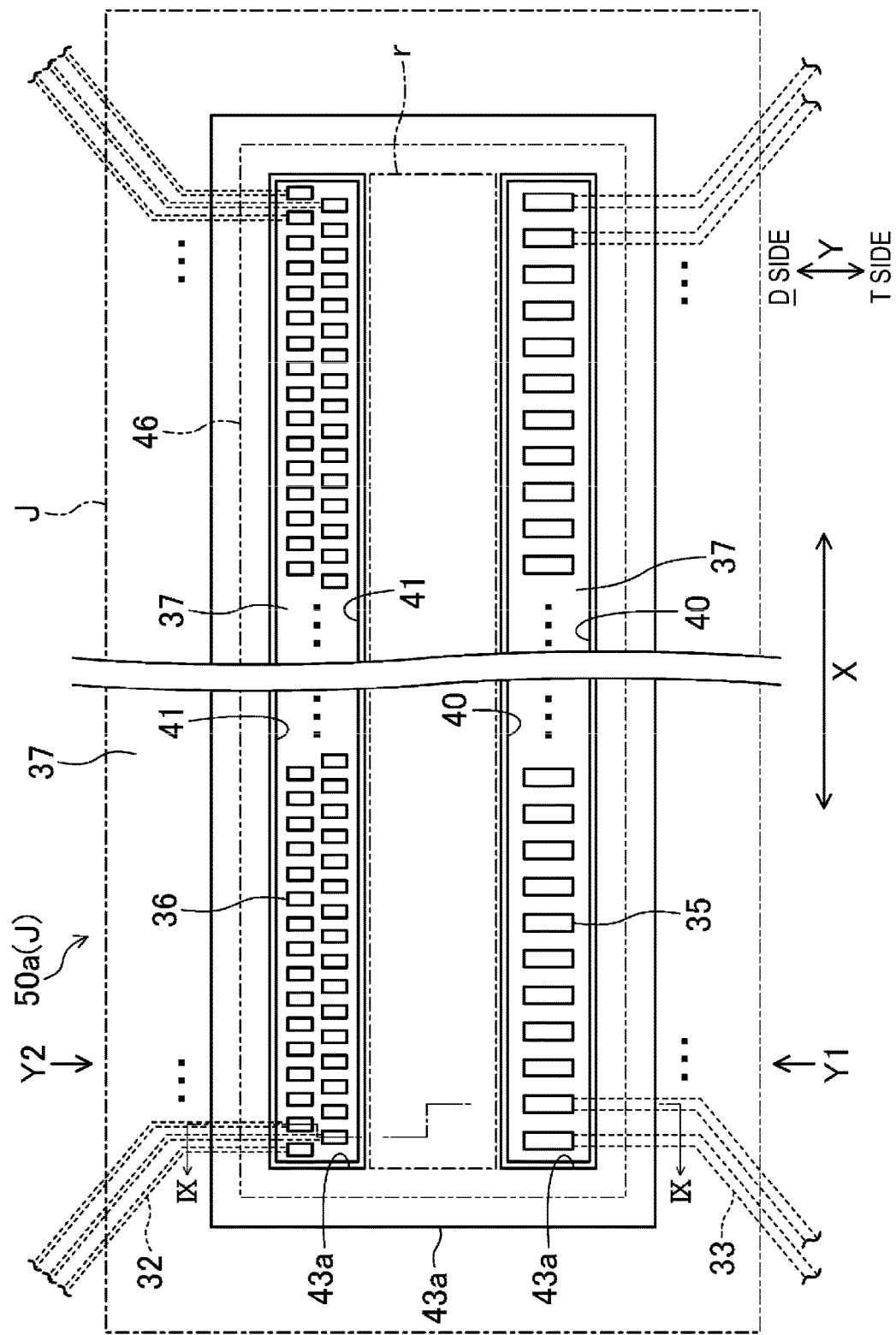
FIG. 8 is a plan view illustrating a terminal connection portion of a frame region of the organic EL display device according to the first embodiment of the disclosure.
Figure 9:
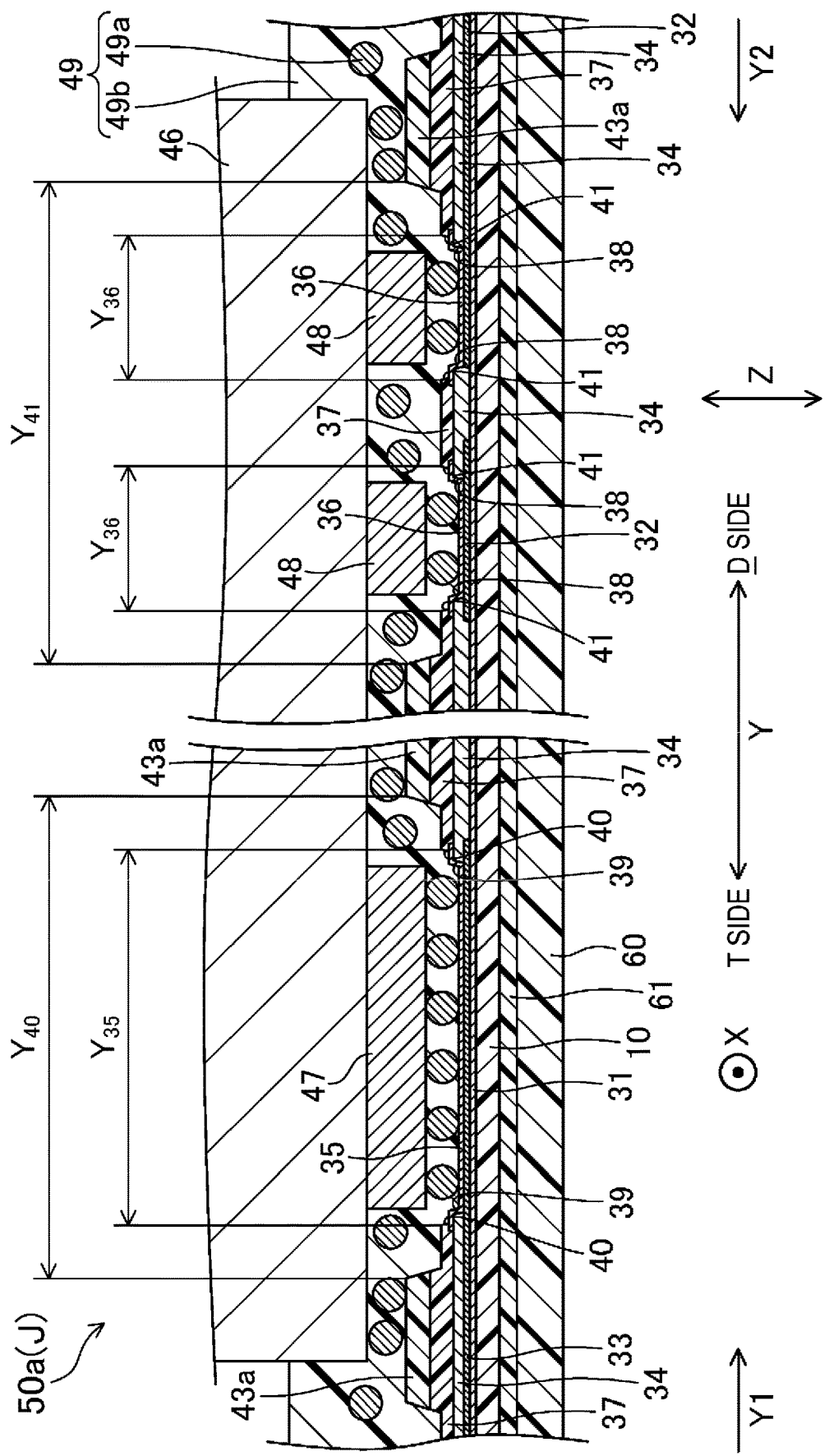
FIG. 9 is an enlarged cross-sectional view, taken along a line IX-IX in FIG. 8, illustrating the terminal connection portion of the frame region of the organic EL display device according to the first embodiment of the disclosure.
Figure 10:
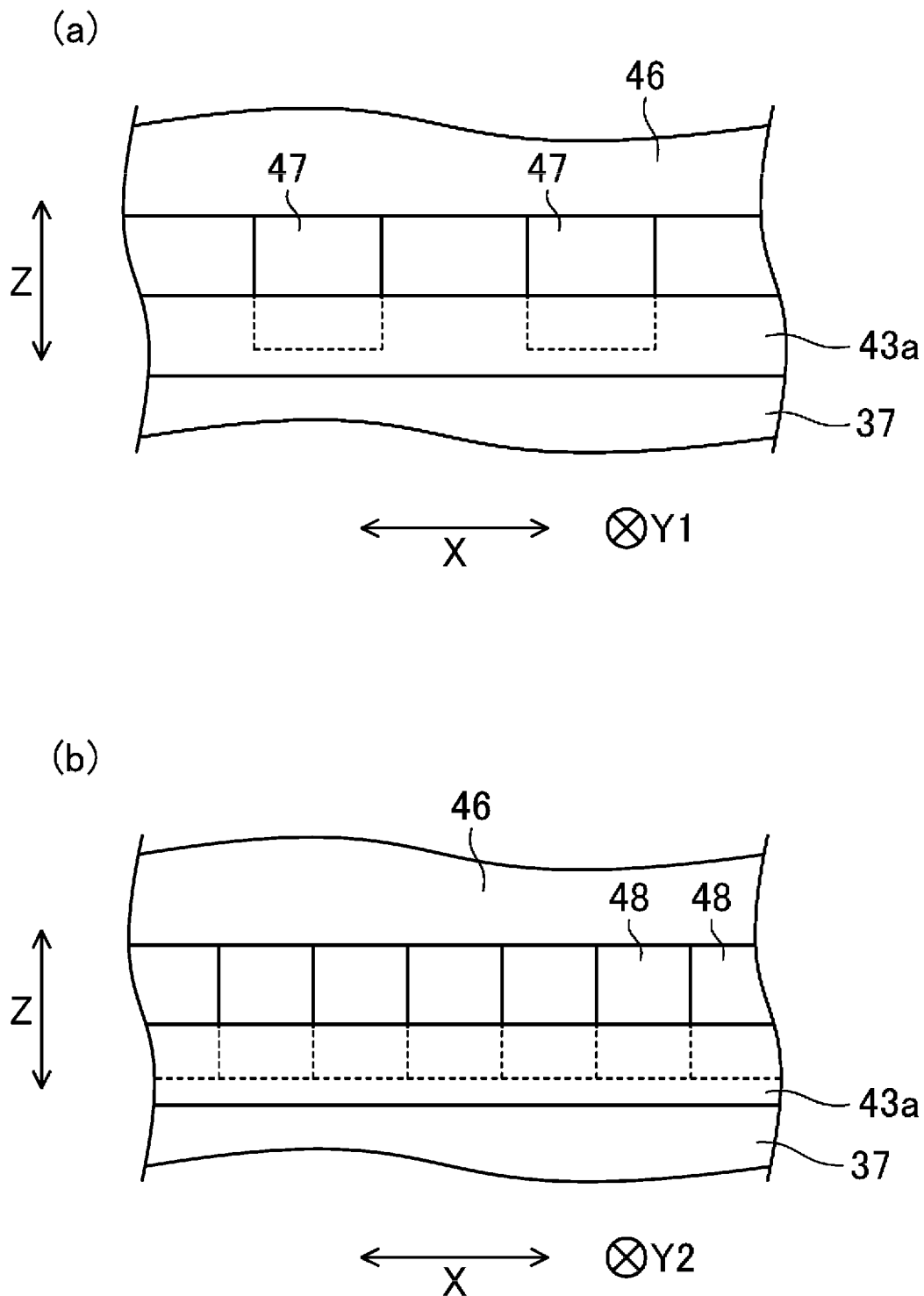
FIGS. 10(*a*) and 10(*b*) are schematic views illustrating the terminal connection portion of the frame region of the organic EL display device according to the first embodiment of the disclosure, as viewed from a direction Y1 in FIG. 9 and a direction Y2 in FIG. 9, respectively.
Figure 11:
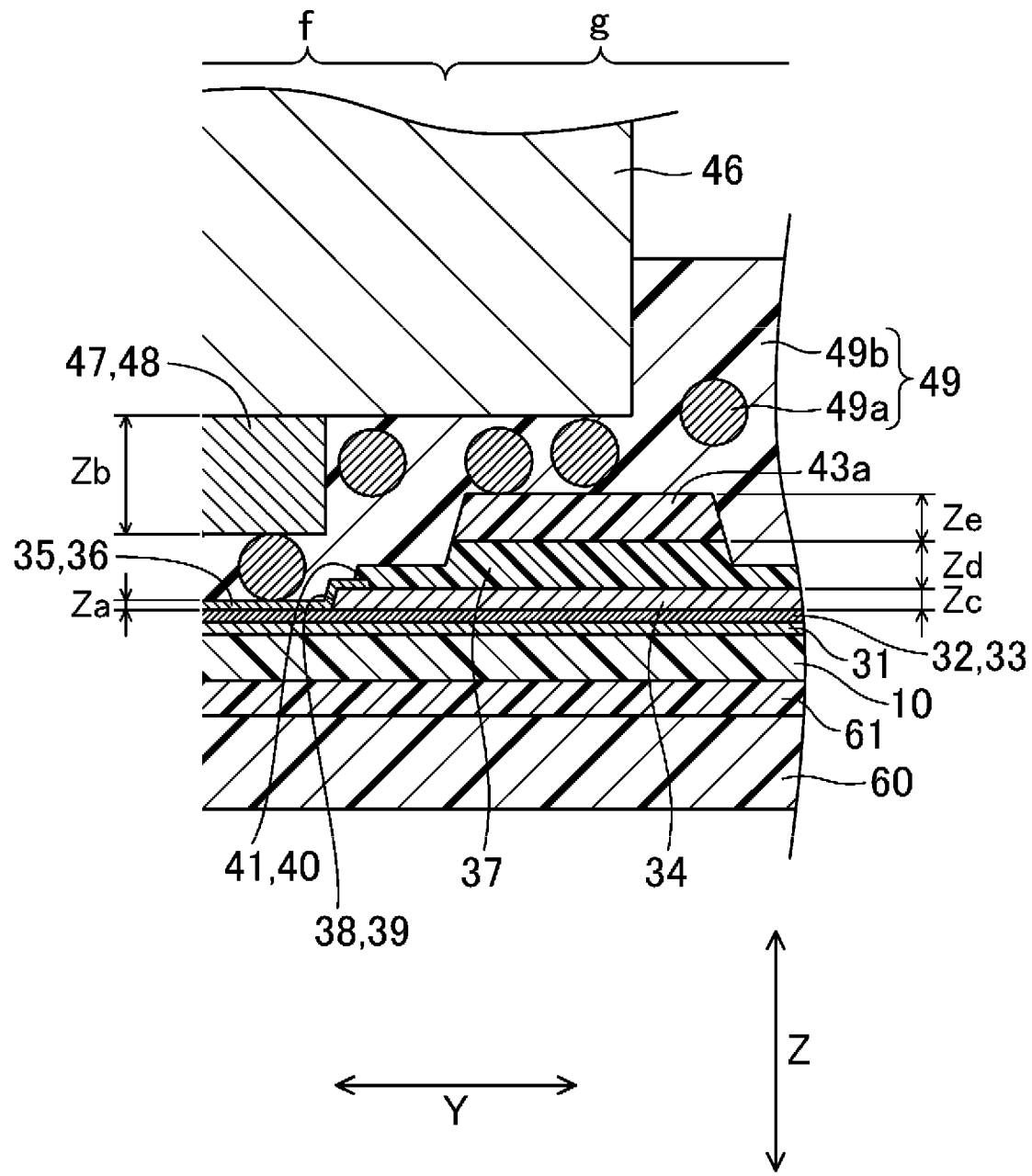
FIG. 11 is an enlarged cross-sectional view for describing the thickness of a protruding portion of the organic EL display device according to the first embodiment of the disclosure.
Figure 12:
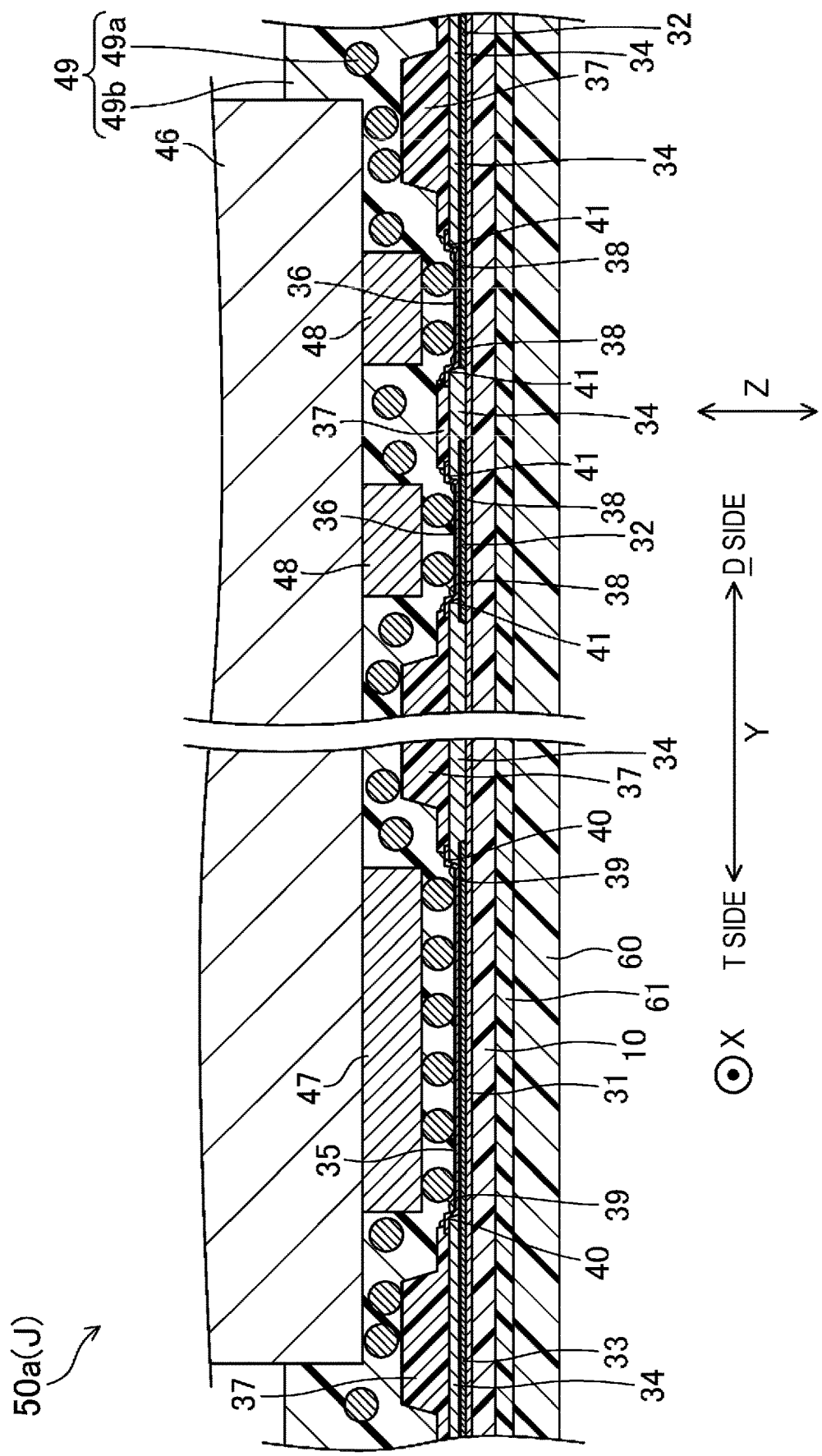
FIG. 12 is an enlarged cross-sectional view of a modified example of the terminal connection portion of the frame region of the organic EL display device according to the first embodiment of the disclosure, and is a view corresponding to FIG. 9.

FIG. 1 to FIG. 12 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50a according to the present embodiment. Further, FIG. 2 is a side view illustrating a schematic configuration of the organic EL display device 50a. Further, FIG. 3 is a plan view of a display region D of the organic EL display device 50a. Further, FIG. 4 is a cross-sectional view of the display region D of the organic EL display device 50a. Further, FIG. 5 is an equivalent circuit diagram illustrating a pixel circuit C of the organic EL display device 50a. Further, FIG. 6 is a cross-sectional view illustrating an organic EL layer 23 configuring the organic EL display device 50a. Further, FIG. 7 is a bottom view of an IC 46 configuring the organic EL display device 50a. Further, FIG. 8 is a plan view illustrating a terminal connection portion J of a frame region F of the organic EL display device 50a. Further, FIG. 9 is an enlarged cross-sectional view, taken along a line IX-IX in FIG. 8, illustrating the terminal connection portion J of the frame region F of the organic EL display device 50a. Further, FIGS. 10(a) and 10(b) are schematic views illustrating the terminal connection portion J of the frame region F of the organic EL display device 50a, as viewed from a direction Y1 in FIG. 9 and a direction Y2 in FIG. 9, respectively. Further, FIG. 11 is an enlarged cross-sectional view for describing the thickness of a protruding portion 43a of the organic EL display device 50a. Further, FIG. 12 is an enlarged cross-sectional view of a modified example of the terminal connection portion J of the frame region F of the organic EL display device 50a, and is a view corresponding to FIG. 9.

As illustrated in FIG. 1 and FIG. 2, the organic EL display device 50a includes, for example, the display region D provided in a rectangular shape and configured to display an image, and the frame region F provided in a frame shape surrounding the display region D. Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 3, a plurality of subpixels p are arrayed in a matrix shape in the display region D. Further, in the display region D, as illustrated in FIG. 3, for example, a subpixel pr including a red light-emitting region Lr configured to display a red color, a subpixel pg including a green light-emitting region Lg configured to display a green color, and a subpixel pb including a blue light-emitting region Lb configured to display a blue color are provided adjacent to one another. Note that, in the display region D, one pixel P is configured, for example, by the three adjacent subpixels pr, pb, and pb including the red light-emitting region Lr, the green light-emitting region Lg, and the blue light-emitting region Lb.

An external terminal portion T is provided in a lower end portion of the frame region F, as illustrated in FIG. 1, and extends in a direction X extending in the lateral direction in the drawing. Further, as illustrated in FIG. 1 and FIG. 2, in the frame region F, the terminal connection portion J is provided between the display region D and the external terminal portion T so as to extend in the direction X. Note that, in the organic EL display device 50a, as illustrated in FIG. 1 and FIG. 2, the direction X parallel to a substrate surface of a resin substrate layer 10 described below, a direction Y perpendicular to the direction X and parallel to the substrate surface of the resin substrate layer 10, and a direction Z perpendicular to the direction X and the direction Y are defined.

Further, as illustrated in FIG. 2 and FIG. 4, the organic EL display device 50a includes, in the display region D, the resin substrate layer 10 provided as a flexible substrate, a thin film transistor (TFT) layer 20 provided on the resin substrate layer 10 and in which a plurality of TFTs are provided, an organic EL element 25 provided on the TFT layer 20 as a light-emitting element configuring the display region D, and a sealing layer 29 provided covering the organic EL element 25. Further, a film layer 60 is provided on the back surface (the right side surface in FIG. 2 and the lower side surface in FIG. 4) of the resin substrate layer 10.

The resin substrate layer 10 is formed of, for example, a polyimide resin, or the like.

As illustrated in FIG. 4, the TFT layer 20 includes a base coat film 11 provided on the resin substrate layer 10, a first TFT 9a, a second TFT 9b, and a capacitor 9c provided on the base coat film 11 for each of the subpixels p as the pixel circuit C (see FIG. 5), and a TFT flattening film 19a provided on each of the first TFTs 9a, the second TFTs 9b, and the capacitors 9c. Here, in the TFT layer 20, a plurality of the pixel circuits C are arrayed in a matrix shape corresponding to the plurality of subpixels p. Further, in the TFT layer 20, as illustrated in FIG. 3 and FIG. 5, a plurality of gate lines 14 are provided so as to extend parallel to each other in the lateral direction in the drawings. Further, in the TFT layer 20, as illustrated in FIG. 3 and FIG. 5, a plurality of source lines 18*f* are provided so as to extend parallel to each other in the vertical direction in the drawings. Further, in the TFT layer 20, as illustrated in FIG. 3 and FIG. 5, a plurality of power source lines 18*g* are provided so as to extend parallel to each other in the vertical direction in the drawings. Note that, as illustrated in FIG. 3, each of the power source lines 18*g* is provided so as to be adjacent to each of the source lines 18*f*.

The base coat film 11 is formed of a single-layer film or a layered film of an inorganic insulating film made of, for example, silicon nitride, silicon oxide, silicon oxynitride, or the like.

The first TFT 9*a* is electrically connected to the corresponding gate line 14 and source line 18*f* in each of the subpixels p, as illustrated in FIG. 5. Further, as illustrated in FIG. 4, the first TFT 9*a* includes a semiconductor layer 12*a*, a gate insulating film 13, a gate electrode 14*a*, a first interlayer insulating film 15, a second interlayer insulating film 17, and a source electrode 18*a* and a drain electrode 18*b*, which are provided sequentially in this order on the base coat film 11. Here, as illustrated in FIG. 4, the semiconductor layer 12*a* is formed of, for example, a polysilicon film, is provided in an island shape on the base coat film 11, and includes a channel region, a source region, and a drain region. Further, as illustrated in FIG. 4, the gate insulating film 13 is provided so as to cover the semiconductor layer 12*a*. Further, as illustrated in FIG. 4, the gate electrode 14*a* is provided on the gate insulating film 13 so as to overlap with the channel region of the semiconductor layer 12*a*. Further, as illustrated in FIG. 4, the first interlayer insulating film 15 and the second interlayer insulating film 17 are sequentially provided so as to cover the gate electrode 14*a*. Further, as illustrated in FIG. 4, the source electrode 18*a* and the drain electrode 18*b* are provided so as to be separated from each other on the second interlayer insulating film 17. Further, as illustrated in FIG. 4, the source electrode 18*a* and the drain electrode 18*b* are electrically connected to the source region and the drain region of the semiconductor layer 12*a*, respectively, via respective contact holes formed in a layered film configured by the gate insulating film 13, the first interlayer insulating film 15, and the second interlayer insulating film 17. Note that the gate insulating film 13, the first interlayer insulating film 15, and the second interlayer insulating film 17 are each constituted by a single-layer film or a layered film of an inorganic insulating film of, for example, silicon nitride, silicon oxide, or silicon oxynitride.

The second TFT 9*b* is electrically connected to the corresponding first TFT 9*a* and power source line 18*g* in each of the subpixels p, as illustrated in FIG. 5. Further, as illustrated in FIG. 4, the second TFT 9*b* includes a semiconductor layer 12*b*, the gate insulating film 13, a gate electrode 14*b*, the first interlayer insulating film 15, the second interlayer insulating film 17, and a source electrode 18*c* and a drain electrode 18*d*, which are provided sequentially in this order on the base coat film 11. Here, as illustrated in FIG. 4, the semiconductor layer 12*b* is formed of, for example, a polysilicon film, is provided in an island shape on the base coat film 11, and includes a channel region, a source region, and a drain region. Further, as illustrated in FIG. 4, the gate insulating film 13 is provided so as to cover the semiconductor layer 12*b*. Further, as illustrated in FIG. 4, the gate electrode 14*b* is provided on the gate insulating film 13 so as to overlap with the channel region of the semiconductor layer 12*b*. Further, as illustrated in FIG. 4, the first interlayer insulating film 15 and the second interlayer insulating film 17 are provided sequentially in this order so as to cover the gate electrode 14*b*. Further, as illustrated in FIG. 4, the source electrode 18*c* and the drain electrode 18*d* are provided so as to be separated from each other on the second interlayer insulating film 17. Further, as illustrated in FIG. 4, the source electrode 18*c* and the drain electrode 18*d* are electrically connected to the source region and the drain region of the semiconductor layer 12*b*, respectively, via respective contact holes formed in the layered film configured by the gate insulating film 13, the first interlayer insulating film 15, and the second interlayer insulating film 17.

Note that in the present embodiment, the first TFT 9*a* and the second TFT 9*b* are exemplified as being of a top-gate type, but the first TFT 9*a* and the second TFT 9*b* may be a bottom-gate type TFT.

The capacitor 9*c* is electrically connected to the corresponding first TFT 9*a* and power source line 18*g* in each of the subpixels p, as illustrated in FIG. 5. Here, the capacitor 9*c* includes, as illustrated in FIG. 4, a lower conductive layer 14*c* formed of the same material as and in the same layer as the gate electrodes 14*a* and 14*b*, the first interlayer insulating film 15 provided so as to cover the lower conductive layer 14*c*, and an upper conductive layer 16 provided on the first interlayer insulating film 15 so as to overlap with the lower conductive layer 14*c*. Note that, as illustrated in FIG. 4, the upper conductive layer 16 is electrically connected to the power source line 18*g* via a contact hole formed in the second interlayer insulating film 17.

The flattening film 19 is formed of, for example, an organic resin material, such as a polyimide resin.

The organic EL element 25 includes, as illustrated in FIG. 4, a plurality of first electrodes 21, an edge cover 22, a plurality of organic EL layers 23 that are provided as a function layer, and a second electrode 24, which are provided sequentially in this order on the flattening film 19.

As illustrated in FIG. 4, the plurality of first electrodes 21 are provided in a matrix shape on the flattening film 19 so as to correspond to the plurality of subpixels p. Further, as illustrated in FIG. 4, each of the first electrodes 21 is electrically connected to the drain electrode 18*d* (or the source electrode 18*c*) of each of the second TFTs 9*b* via a contact hole formed in the flattening film 19*a*. Further, the first electrodes 21 have a function of injecting holes (positive holes) into the organic EL layer 23. Further, the first electrodes 21 are preferably formed of a material with a high work function to improve the efficiency of hole injection into the organic EL layers 23. Here, examples of a material constituting the first electrodes 21 include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, the material constituting the first electrodes 21 may be an alloy of astatine (At)/astatine oxide ($AtO_2$), and the like, for example. Furthermore, the material constituting the first electrodes 21 may be an electrically conductive oxide such as tin oxide (SnO), zinc oxide (ZnO), indium tin oxide (ITO), or indium zinc oxide (IZO), or the like, for example. Further, the first electrodes 21 may be formed by layering a plurality of layers formed of any of the materials described above. Note that, examples of a compound material having a large work function include indium tin oxide (ITO) and indium zinc oxide (IZO).

As illustrated in FIG. 4, the edge cover 22 is provided in a lattice pattern so as to cover a peripheral portion of each of the first electrodes 21. Here, examples of a material constituting the edge cover 22 include a positive-working photosensitive resin such as a polyimide resin, an acrylic resin, a polysiloxane resin, and a novolak resin. Further, as illustrated in FIG. 4, a portion of a surface of the edge cover 22 projects upward in the drawing, and forms a pixel photo spacer provided in an island shape.

As illustrated in FIG. 4, the plurality of organic EL layers 23 are disposed on each of the first electrodes 21, and are provided in a matrix shape so as to correspond to the plurality of subpixels p. Here, as illustrated in FIG. 6, each of the organic EL layers 23 includes a hole injection layer 1, a hole transport layer 2, a light-emitting layer 3, an electron transport layer 4, and an electron injection layer 5, which are provided sequentially in this order on the first electrode 21.

The hole injection layer 1 is also referred to as an anode electrode buffer layer, and functions to reduce an energy level difference between the first electrodes 21 and the organic EL layers 23 to thereby improve the efficiency of hole injection into the organic EL layers 23 from the first electrodes 21. Here, examples of a material constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like.

The hole transport layer 2 functions to improve the efficiency of hole transport from the first electrodes 21 to the organic EL layers 23. Here, examples of a material constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region where holes and electrons are injected from the first electrode 21 and the second electrode 24, respectively, and the holes and the electrons recombine, when a voltage is applied via the first electrode 21 and the second electrode 24. Here, the light-emitting layer 3 is formed of a material having high light-emitting efficiency. Moreover, examples of a material constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane, and the like.

The electron transport layer 4 functions to facilitate migration of electrons to the light-emitting layer 3 efficiently. Here, examples of a material constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds, and the like, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode electrode buffer layer. Here, examples of a material constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO), and the like.

As illustrated in FIG. 4, the second electrode 24 is provided so as to cover each of the organic EL layers 23 and the edge cover 22. Further, the second electrode 24 functions to inject electrons into the organic EL layer 23. Further, the second electrode 24 is preferably formed of a material with a low work function to improve the efficiency of electron injection into the organic EL layer 23. Here, examples of a material constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further, the second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (Al), for example. Further, the second electrode 24 may be formed of an electrically conductive oxide, for example, tin oxide (SnO), zinc oxide (ZnO), indium tin oxide (ITO), indium zinc oxide (IZO), or the like. Further, the second electrode 24 may be formed by layering a plurality of layers formed of any of the materials described above. Note that, examples of a material having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

As illustrated in FIG. 4, the sealing film 29 includes a first inorganic film 26 provided so as to cover the second electrode 24, an organic film 27 provided on the first inorganic film 26, and a second inorganic film 28 provided so as to cover the organic film 27, and functions to protect the organic EL layers 23 from moisture, oxygen, and the like. Here, the first inorganic insulating film 26 and the second inorganic insulating film 28 are formed of, for example, an inorganic material such as silicon oxide ($SiO_2$), aluminum oxide ($Al_2O_3$), silicon nitride (SiNx (x is a positive number)) such as trisilicon tetranitride ($Si_3N_4$) or silicon carbonitride (SiCN). Further, the organic film 27 is formed of, for example, an organic material such as an acrylic resin, a polyurea resin, a parylene resin, a polyimide resin, and a polyamide resin.

As illustrated in FIG. 2 and FIG. 4, the film layer 60 is bonded to a surface, of the resin substrate layer 10, opposite from the surface on which the TFT layer 20 is provided, for example, via an adhesive layer 61. Further, the film layer 60 is disposed over the entire display region D and frame region F. Note that the film layer 60 is constituted by, for example, a plastic film formed of a polyethylene terephthalate (PET) resin or the like.

Further, in the organic EL display device 50a, as illustrated in FIG. 1, a plurality of external terminal electrodes 30 are arrayed in the external terminal portion T of the frame region F. These external terminal electrodes 30 are provided for inputting a signal from the outside, and are electrically connected to a corresponding electrode of a flexible printed circuit (FPC) (not illustrated) and the like, via an ACF, for example.

Further, as illustrated in FIG. 1 and FIG. 2, the organic EL display device 50a includes an IC 46 provided as an electronic component in the terminal connection portion J of the frame region F, and includes the film layer 60 provided on the back surface (a surface opposite from a surface on which the IC 46 is provided) of the resin substrate layer 10.

The IC 46 is, for example, a drive IC for supplying a drive signal to each of the pixel circuits C, and is compression-bonded and connected to the terminal connection portion J, as illustrated in FIG. 1 and FIG. 2. As illustrated in FIG. 7, a plurality of input bumps 47 to which signals are input, and a plurality of output bumps 48 from which signals are output are disposed on the back surface (a surface to be mounted on the terminal connection portion J) of the IC 46. Then, as illustrated in FIG. 7, an input bump region R47 surrounding all of the plurality of input bumps 47, and an output bump region R48 surrounding all of the plurality of output bumps 48 are both provided on the back surface of the IC 46. Note that, as illustrated in FIG. 7, the input bumps 47 and the output bumps 48 (hereinafter also referred to as the "bumps 47, 48") are not disposed between the input bump region R47 and the output bump region R48 (hereinafter also referred to as the "bump regions R47 and R48"), in other words, are not disposed in a central portion of the back surface of the IC 46.

The input bumps 47 are arrayed in a single row along one side edge in the longitudinal direction (the direction X in FIG. 7) of the IC 46, and the output bumps 48 are arrayed in two rows in a staggered manner in a plan view along the other side edge. Further, the output bump 48 has a smaller area than that of the input bump 47, and the number of output bumps 48 is greater than that of the input bumps 47. Further, the bumps 47, 48 are each formed in a rectangular shape in a plan view.

Further, as illustrated in FIG. 9 and FIG. 11, the organic EL display device 50a includes, in the terminal connection portion J, a first inorganic insulating film 31, a plurality of first lead wiring lines 32 and a plurality of second lead wiring lines 33, a second inorganic insulating film 34, a plurality of input terminal electrodes 35 and a plurality of output terminal electrodes 36, an electrode insulating film 37 provided as an insulating film, and a protruding portion 43a, which are provided sequentially in this order on the resin substrate layer 10.

The first inorganic insulating film 31 is a moisture-proof film provided on the resin substrate layer 10, and is formed of the same material as and in the same layer as the base coat film 11, the gate insulating film 13, the first interlayer insulating film 15, and the like.

The plurality of first lead wiring lines 32 and the plurality of second lead wiring lines 33 (hereinafter also referred to as the "lead wiring lines 32, 33") are both provided on the first inorganic insulating films 31, as illustrated in FIG. 9 and FIG. 11. Each of these lead wiring lines 32, 33 are formed of the same material as and in the same layer as the gate electrode 14a, the upper conductive layer 16, and the like.

Further, each of the first lead wiring lines 32 is electrically connected to a corresponding one of the output terminal electrodes 36, and is configured to input a signal to each of the pixel circuits C. On the other hand, each of the second lead wiring lines 33 is electrically connected to a corresponding one of the external terminal electrodes 30 and a corresponding of the input terminal electrodes 35. In other words, each of the external terminal electrodes 30 and a corresponding one of the input terminal electrodes 35 are electrically connected to each other via a corresponding one of the second lead wiring lines 33.

As illustrated in FIG. 9 and FIG. 11, the second inorganic insulating film 34 is provided on the first inorganic insulating film 31 and on the first lead wiring lines 32 and the second lead wiring lines 33.

Further, as illustrated in FIG. 9 and FIG. 11, first wiring line openings 38 that overlap with each of the output bumps 48 in a plan view and expose each of the first lead wiring lines 32, and second wiring line openings 39 that overlap with each of the input bumps 47 in a plan view and expose the second lead wiring lines 33 are both formed in the second inorganic insulating film 34. Then, in the first wiring line openings 38, each of the output terminal electrodes 36 is in contact with each of the exposed first lead wiring lines 32, and in the second wiring line openings 39, each of the input terminal electrodes 35 is in contact with each of the exposed second lead wiring lines 33.

Note that the second inorganic insulating film 34 is formed of the same material as and in the same layer as the first interlayer insulating film 15, the second interlayer insulating film 17, and the like.

Here, when the lead wiring lines 32, 33 are constituted by the gate electrode 14a, the first inorganic insulating film 31 is constituted by the base coat film 11 and the gate insulating film 13, and the second inorganic insulating film 34 is constituted by the first interlayer insulating film 15 and the second interlayer insulating film 17. On the other hand, when the lead wiring lines 32, 33 are constituted by the upper conductive layer 16, the first inorganic insulating film 31 is constituted by the base coat film 11, the gate insulating film 13, and the first interlayer insulating film 15, and the second inorganic insulating film 34 is constituted by the second interlayer insulating film 17.

As illustrated in FIG. 9 and FIG. 11, each of the input terminal electrodes 35 is provided on the second lead wiring line 33 exposed from the second wiring line opening 39 and on a peripheral portion of the second inorganic insulating film 34, so as to overlap with a corresponding one of the input bumps 47 in a plan view. On the other hand, each of the output terminal electrodes 36 is provided on the first lead wiring line 32 exposed from the first wiring line opening 38 and on the peripheral portion of the second inorganic insulating film 34, so as to overlap with a corresponding one of the output bumps 48 in a plan view.

More specifically, as illustrated in FIG. 8, each of the plurality of input terminal electrodes 35 is formed in a rectangular shape in a plan view corresponding to a corresponding one of the input bumps 47, and each of the plurality of output terminal electrodes 36 is formed in a rectangular shape in a plan view corresponding to a corresponding one of the output bumps 48. Further, the input terminal electrodes 35 are arrayed in a single row along one side edge of the terminal connection portion J, and the output terminal electrodes 36 are arrayed in two rows in a staggered manner in a plan view along the other side edge. Further, the output terminal electrode 36 has a smaller area than that of the input terminal electrode 35, and the number of output terminal electrodes 36 is greater than that of the input terminal electrodes 35. Note that in FIG. 8, the IC 46 is illustrated in a simplified manner, and the bumps 47, 48 of the IC 46 are omitted.

On the other hand, as illustrated in FIG. 8, between the input terminal electrodes 35 and the output terminal electrodes 36 (hereinafter also referred to as the "terminal electrodes 35, 36"), in other words, in a central portion of the terminal connection portion J corresponding to a central portion of the IC 46, an inter-electrode region r is provided in which the terminal electrodes 35, 36 are not arrayed.

Further, each of the input terminal electrodes 35 is electrically connected to a corresponding one of the input bumps 47 via an ACF 49, and each of the output terminal electrodes 36 is electrically connected to a corresponding one of the output bumps 48 via the ACF 49. These terminal electrodes 35, 36 are both formed of the same material as and in the same layer as the source line 18$f$.

As illustrated in FIG. 9 and FIG. 11, the electrode insulating film 37 is provided on the terminal electrodes 35, 36 and the second inorganic insulating film 34, so as to cover peripheral portions of the terminal electrodes 35, 36. In other words, the electrode insulating film 37 serves as an edge cover and a flattening film of the terminal electrodes 35, 36. This electrode insulating film 37 is constituted by an organic insulating film as a single layer film or a layered film, and is formed of, for example, the same material as the flattening film 19.

Further, as illustrated in FIG. 8, FIG. 9, and FIG. 11, an input electrode opening 40 exposing all of the input terminal electrodes 35, and an output electrode opening 41 exposing all of the output terminal electrodes 36 are both formed in the electrode insulating film 37.

The input electrode opening portion 40 is formed in a rectangular shape in a plan view along the direction X in which the terminal connection portion J extends, so as to surround all of the input terminal electrodes 35. The output electrode opening 41 is formed in a rectangular shape in a plan view along the direction X so as to surround all of the output terminal electrodes 36. As illustrated in FIG. 8, the input electrode opening 40 and output electrode opening 41 (hereinafter also referred to as the "electrode openings 40, 41") are formed on both ends, in the direction Y, of the inter-electrode region r. In other words, the electrode openings 40, 41 are formed corresponding to the bump regions R47 and R48, respectively. Note that a planar shape of the electrode openings 40, 41 is not limited to a rectangular shape illustrated in the drawing, and may be, for example, a polygonal shape, a trapezoidal shape, an elliptical shape, or the like.

Further, as illustrated in FIG. 9, in the direction Y, the input electrode opening 40 is formed so that an opening edge dimension $Y_{40}$ thereof is greater than a dimension $Y_{35}$ of the input terminal electrode 35, and the output electrode opening 41 is formed so that a dimension $Y_{41}$ thereof is greater than a dimension $Y_{36}$ of the output terminal electrode 36. This configuration is adopted to stop the bumps 47, 48 from overlapping, in a plan view, with the protruding portion 43$a$ described below, even when the position of the IC 46 is shifted in the direction Y when compression-bonding the IC 46 to the terminal connection portion J. Note that, for example, as illustrated in FIG. 9, when the plurality of output terminal electrodes 36 (two in FIG. 9) are disposed along the direction Y in the output electrode opening 41, it is sufficient that the dimension $Y_{41}$ of the output electrode opening 41 be adjusted to be greater than a dimension obtained by multiplying the dimension $Y_{36}$ of the output terminal electrode 36 by the number of output terminal electrodes 36 disposed. However, the dimension $Y_{40}$ of the input electrode opening 40 and the dimension $Y_{41}$ of the output electrode opening 41 are adjusted so that the electrode openings 40, 41 are smaller than an outer edge portion of the IC 46.

Here, in the organic EL display device 50$a$, as illustrated in FIG. 9 and FIG. 11, the protruding portion 43$a$ is provided on the electrode insulating film 37 so as to protrude in a direction toward the IC 46. This protruding portion 43$a$ is constituted by an organic insulating film as a single layer film or a layered film, and is formed of the same material as and in the same layer as the edge cover 22, for example.

As illustrated in FIG. 8, the protruding portion 43$a$ is provided along the periphery of the input electrode opening 40 so as to surround the input electrode opening 40, and is also provided along the periphery of the output electrode opening 41 so as to surround the output electrode opening 41. In other words, the protruding portion 43$a$ is provided along the periphery of the input bump region R47, and is also provided along the periphery of the output bump 48. In this way, the protruding portion 43$a$ is configured in a frame shape in a plan view corresponding to the contour (an outer peripheral portion) of the IC 46 surrounding all of the bumps 47, 48.

Further, as illustrated in FIG. 8, the protruding portion 43$a$ is provided in a band shape in a plan view along the direction X in which the terminal connection portion J extends, between the input electrode opening 40 and the output electrode opening portion 41 (namely, in the inter-electrode region r). In other words, the protruding portion 43$a$ is provided corresponding to a region between the input bump region R47 and the output bump region R48 (namely, the central portion of the IC 46).

Here, as illustrated in FIG. 8 and FIG. 9, the protruding portion 43$a$ overlaps with the IC 46 in a plan view via the ACF 49 at an end portion (the outer peripheral portion) and the central portion of the IC 46. Further, as illustrated in FIG. 9 and FIG. 10, the protruding portion 43$a$ overlaps with the bumps 47, 48 when viewed from a direction parallel to the substrate surface of the resin substrate layer 10. Note that the direction parallel to the substrate surface of the resin substrate layer 10 includes all directions in FIG. 9 and FIG. 10 such as a direction parallel to the direction X, a direction parallel to the direction Y (the directions Y1, Y2, and the like), and a direction parallel to a direction inclined with respect to the direction X and the direction Y, for example. In other words, the protruding portion 43$a$ does not overlap with the bumps 47, 48 in a plan view.

In this way, in a plan view, the protruding portion 43$a$ is disposed along the outer peripheral portion of the IC 46 so as to overlap with the IC 46 and so as not to overlap with the bumps 47, 48. Thus, when the IC 46 is compression-bonded to the terminal connection portion J, a bottom surface portion, along the outer peripheral portion, of the IC 46 is in contact with the protruding portion 43$a$ via conductive particles 49$a$ of the ACF 49. As a result, warping of the resin substrate layer 10 and the film layer 60 along the outer peripheral portion of the IC 46 is reduced.

Further, in a plan view, the protruding portion 43a is disposed corresponding to the central portion of the IC 46 so as to overlap with the IC 46 and so as not to overlap with the bumps 47, 48. Thus, when the IC 46 is compression-bonded to the terminal connection portion J, the bottom surface portion, in the central portion, of the IC 46 is in contact with the protruding portion 43a via the conductive particles 49a of the ACF 49. As a result, the warping of the resin substrate layer 10 and the film layer 60 corresponding to the central portion of the IC 46 is reduced.

Then, as a result of the warping of the resin substrate layer 10 being reduced when compression-bonding the IC 46 to the terminal connection portion J, there is a reduction in stress applied to the inorganic insulating layers including the first inorganic insulating film 31, the second inorganic insulating film 34, and the electrode insulating film 37, and the like, and the metal layers including the lead wiring lines 32, 33, the terminal electrodes 35, 36, and the like, which are provided on the resin substrate layer 10.

Further, since the coefficient of linear expansion of the film layer 60 is generally greater than the coefficient of linear expansion of the resin substrate layer 10, the film layer 60 expands more than the resin substrate layer 10 when compression-bonding the IC 46 to the terminal connection portion J. Thus, in an organic EL display device in which the protruding portion 43a is not provided, after compression-bonding the IC 46, of the resin substrate layer 10, the adhesive layer 61, and the film layer 60 corresponding to the outer peripheral portion and the central portion of the IC 46, layers bonded together with the weakest adhesive force may peel from each other. More specifically, the peeling may occur with the adhesive layer 61 between the resin substrate layer 10 and the film layer 60 serving as a boundary, due to a difference in the stress applied to the resin substrate layer 10 and to the film layer 60 provided below the resin substrate layer 10. In contrast, in the organic EL display device 50a, since the contact area over which the bottom surface of the IC 46 is in contact with the protruding portion 43a via the conductive particles 49a of the ACF 49 is large, the warping of the resin substrate layer 10 and the film layer 60 is reduced. As a result, the above-described difference in stress is reduced, and the above-described interlayer peeling after the compression-bonding of the IC 46 is suppressed.

Further, in the organic EL display device in which the protruding portion 43a is not provided, after compression-bonding the IC 46, the terminal electrodes 35, 36 may deform into a concave shape in a cross-sectional view. In this case, mechanical connectivity between outer peripheral portions and central portions of the bumps 47, 48, and the conductive particles 49a is weakened, and as a result, there is a risk that electrical connectivity may deteriorate. In contrast, in the organic EL display device 50a, since the protruding portion 43a is provided corresponding to both the outer peripheral portion and the central portion of the IC 46, the warping of the resin substrate layer 10 is reduced, and the terminal electrodes 35, 36 provided in the layer above the resin substrate layer 10 become less likely to deform into a concave shape in a cross-sectional view. As a result, the mechanical connectivity is maintained, and the deterioration in the electrical connectivity is suppressed. Note that, even when the protruding portion 43a is provided corresponding to only one of the outer peripheral portion and the central portion of the IC 46, the warping of the resin substrate layer 10 is reduced. However, since the resin substrate layer 10 is flexible, when the protruding portion 43a is provided corresponding to both the outer peripheral portion and the central portion of the IC 46, the warping of the resin substrate layer 10 can be further reduced, and effects on the mechanical connectivity and the electrical connectivity are improved.

Note that, as illustrated in FIG. 11, a thickness Ze (a dimension in the direction Z) of the protruding portion 43a may be determined so that the protruding portion 43a comes into contact with the bottom surface of the IC 46 via the conductive particles 49a, in accordance with a thickness Zc of the second inorganic insulating film 34, a thickness Za of the terminal electrode 35, 36, and a thickness Zd of the electrode insulating film 37.

More specifically, as illustrated in FIG. 11, excluding the particle size of the conductive particles 49a, when a height (a dimension in the direction Z) of a panel electrode portion (on the side of the bumps 47, 48) f between electrode layer surfaces, that is, between the bottom surface of the IC 46 and the lead wiring lines 32, 33 is Zf, and a height of an IC end portion (on the side of the protruding portion 43a) g between the electrode layer surfaces, that is, between the bottom surface of the IC 46 and the lead wiring lines 32, 33 is Zg, the thickness Ze may be determined so that a value of a step A between the height Zf of the panel electrode portion f and the height Zg of the IC end portion g, which is expressed by Equation 1 below, becomes small. Note that a height Zb of the bumps 47, 48 is, for example, approximately 7 μm. Further, the particle size of the conductive particles 49a is, for example, approximately 2 to 4 μm.

$$\Delta = Zf - Zg \text{ (where } Zf = Za + Zb, \text{ and } Zg = Zc + Zd + Ze\text{)} \quad \text{[Equation 1]}$$

In the organic EL display device 50a described above, in each of the subpixels p, a gate signal is input to the first TFT 9a via the gate line 14 to turn on the first TFT 9a, a data signal is written in the gate electrode 14b of the second TFT 9b and the capacitor 9c via the source line 18f, and a current from the power source line 18g corresponding to a gate voltage of the second TFT 9b is supplied to the organic EL layer 23, whereby the light-emitting layer 3 of the organic EL layer 23 emits light to display an image. Note that in the organic EL display device 50a, even when the first TFT 9a is turned off, the gate voltage of the second TFT 9b is held by the capacitor 9c. Thus, the light emission by the light-emitting layer 3 is maintained until the gate signal of the next frame is input.

Next, a method for manufacturing the organic EL display device 50a according to the present embodiment will be described. The method for manufacturing the organic EL display device 50a according to the present embodiment includes a resin substrate layer forming step, a thin film transistor layer forming step, an organic EL element forming step, a sealing layer forming step, an external terminal portion forming step, a terminal connection portion forming step, and a film bonding step.

Resin Substrate Layer Forming Step

For example, the resin substrate layer 10 is formed by applying a non-photosensitive polyimide resin on a support substrate (not illustrated) such as a glass substrate, and then performing prebaking and postbaking with respect to the applied film.

Thin Film Transistor Forming Step

The TFT layer 20 is formed by forming the base coat film 11, the first TFT 9a, the second TFT 9b, the capacitor 9c, and the flattening film 19 on the resin substrate layer 10 formed at the above-described resin substrate layer forming step, using a known method, for example.

Organic EL Element Forming Step

The organic EL element 25 is formed by forming the first electrode 21, the edge cover 22, the organic EL layer 23 (the hole injection layer 1, the hole transport layer 2, the light-emitting layer 3, the electron transport layer 4, and the electron injection layer 5), and the second electrode 24 on the flattening film 19 of the TFT layer 20 formed at the above-described thin film transistor forming step, using a known method.

Sealing Layer Forming Step

First, the first inorganic insulating film 26 is formed, for example, by film-forming, using a plasma CVD method, an inorganic insulating film such as a silicon nitride film, a silicon oxide film, or a silicon oxynitride film on a substrate surface on which the organic EL element 25 has been formed at the organic EL element forming step, while using a mask.

Subsequently, the organic film 27 is formed, for example, by film-forming, using an ink-jet method, an organic resin material such as an acrylic resin on a substrate surface on which the first inorganic insulating film 26 has been formed.

Furthermore, the sealing film 29 is formed by forming the second inorganic insulating film 28, for example, by film-forming, using the plasma CVD method, an inorganic insulating film such as a silicon nitride film, a silicon oxide film, or a silicon oxynitride film on the substrate surface on which the organic film 27 has been formed, while using a mask.

External Terminal Portion Forming Step

The external terminal portion T is formed by forming the external terminal electrodes 30 on the second interlayer insulating film 17 in an end portion of the frame region F, using a known method.

Terminal Connection Portion Forming Step

In the frame region F between the display region D and the external terminal portion T, the terminal connection portion J is formed by forming the first inorganic insulating film 31, the lead wiring lines 32, 33, the second inorganic insulating film 34, the terminal electrodes 35, 36, the electrode insulating film 37, and the protruding portion 43a on the resin substrate layer 10, using a known method. Note that the first inorganic insulating film 31, the lead wiring lines 32, 33, the second inorganic insulating film 34, the terminal electrodes 35, 36, and the electrode insulating film 37 may be formed simultaneously when forming the base coat film 11, the gate insulating film 13 of the first TFT 9a, the gate electrode 14a, the first interlayer insulating film 15, the second interlayer insulating film 17, the source electrode 18a, the flattening film 19, and the like at the above-described thin film transistor layer forming step. Further, the protruding portion 43a may be formed simultaneously when forming the edge cover 22 at the above-described organic EL element forming step.

More specifically, after forming the second inorganic insulating film 34, and before forming the terminal electrodes 35, 36, the first wiring line openings 38 and the second wiring line openings 39 are formed in the second inorganic insulating film 34 by dry etching. After that, the terminal electrodes 35, 36 are formed to fill the first wiring line openings 38 and the second wiring line openings 39.

Subsequently, after forming the electrode insulating film 37, and before forming the protruding portion 43a, by forming the electrode openings 40, 41 in the electrode insulating film 37 by dry etching, all of the terminal electrodes 35, 36 are exposed, and the edge covers of the terminal electrodes 35, 36 are also formed.

Finally, the protruding portion 43a is formed on the electrode insulating film 37 along the periphery of the electrode openings 40, 41. Note that the thickness of the protruding portion 43a may be adjusted by performing gray tone processing, or the like on the photomask side, so that the electrode insulating film 37 is not cut as a result of etching performed after patterning the protruding portion 43a.

Film Bonding Step

After the resin substrate layer forming step, the support substrate is peeled from the surface, of the resin substrate layer 10, opposite from the surface on which the TFT layer 20 is provided, by irradiating the resin substrate layer 10 with laser light from the support substrate side. Subsequently, the film layer 60 is bonded, via the adhesive layer 61, to the surface of the resin substrate layer 10 from which the support substrate has been peeled.

In the above-described manner, the organic EL display device 50a of the present embodiment can be manufactured.

Note that, as illustrated in FIG. 12, in the organic EL display device 50a, a protruding portion may be configured by thickening the electrode insulating film 37 without providing the protruding portion 43a on the electrode insulating film 37. In this case, at the above-described terminal connection portion forming step, the terminal electrodes 35, 36 are exposed, the edge covers thereof are formed by etching, and the peripheries thereof are cut in a shallow manner by performing the gray tone processing, halftone processing, or the like to create a step in the electrode insulating film 37. On the other hand, by maintaining the electrode insulating film 37 corresponding to the outer peripheral portion and the central portion of the IC 46 as is without performing the etching thereon, a protruding portion can be formed by the thickened electrode insulating film 37.

As discussed above, according to the organic EL display device 50a of the present embodiment, the following effects can be obtained.

(1) Since the protruding portion 43a overlaps with the IC 46 in a plan view, and overlaps with the bumps 47, 48 when viewed from a direction parallel to the substrate surface of the resin substrate layer 10, the bottom surface of the IC 46 and the protruding portion 43a come into contact with each other via the conductive particles 49a of the ACF 49 when compression-bonding the IC 46 to the terminal connection portion J. As a result, the warping of the resin substrate layer 10 and the film layer 60 when compression-bonding the IC 46 to the terminal connection portion J is reduced.

(2) As a result of the warping of the resin substrate layer 10 when compression-bonding the IC 46 to the terminal connection portion J being reduced, stress applied to the inorganic insulating layers and the metal layers provided on the resin substrate layer 10 is reduced. As a result, generation of cracks in the inorganic insulating layers, and disconnection of each of the electrodes and the wiring lines made from the metal layers are suppressed.

(3) Since the protruding portion 43a is disposed corresponding to the outer peripheral portion and the central portion of the IC 46, stress applied to the resin substrate layer 10 and the film layer 60 after compression-bonding the IC 46 is reduced, and the difference in stress is reduced. As a result, the peeling occurring with the adhesive layer 61 between the resin substrate layer 10 and the film layer 60 serving as the boundary is suppressed.

(4) As a result of the stress applied to the resin substrate layer 10 after compression-bonding the IC 46 being reduced, the terminal electrodes 35, 36 are less likely to deform into a concave shape in a cross-sectional view after compression-bonding the IC 46. As a result, the mechanical connectivity is maintained, and the deterioration in the electrical connectivity is suppressed.

(5) As a result of the generation of cracks in the inorganic insulating layers, and the disconnection of each of the electrodes and the wiring lines made from the metal layers being suppressed, degradation of a sealing performance, electrical characteristics, and environmental resistance performance of the organic EL display device 50a is suppressed. As a result, a problem such as a reduction in the life of the organic EL display device 50a can be prevented.

Second Embodiment

Figure 13:
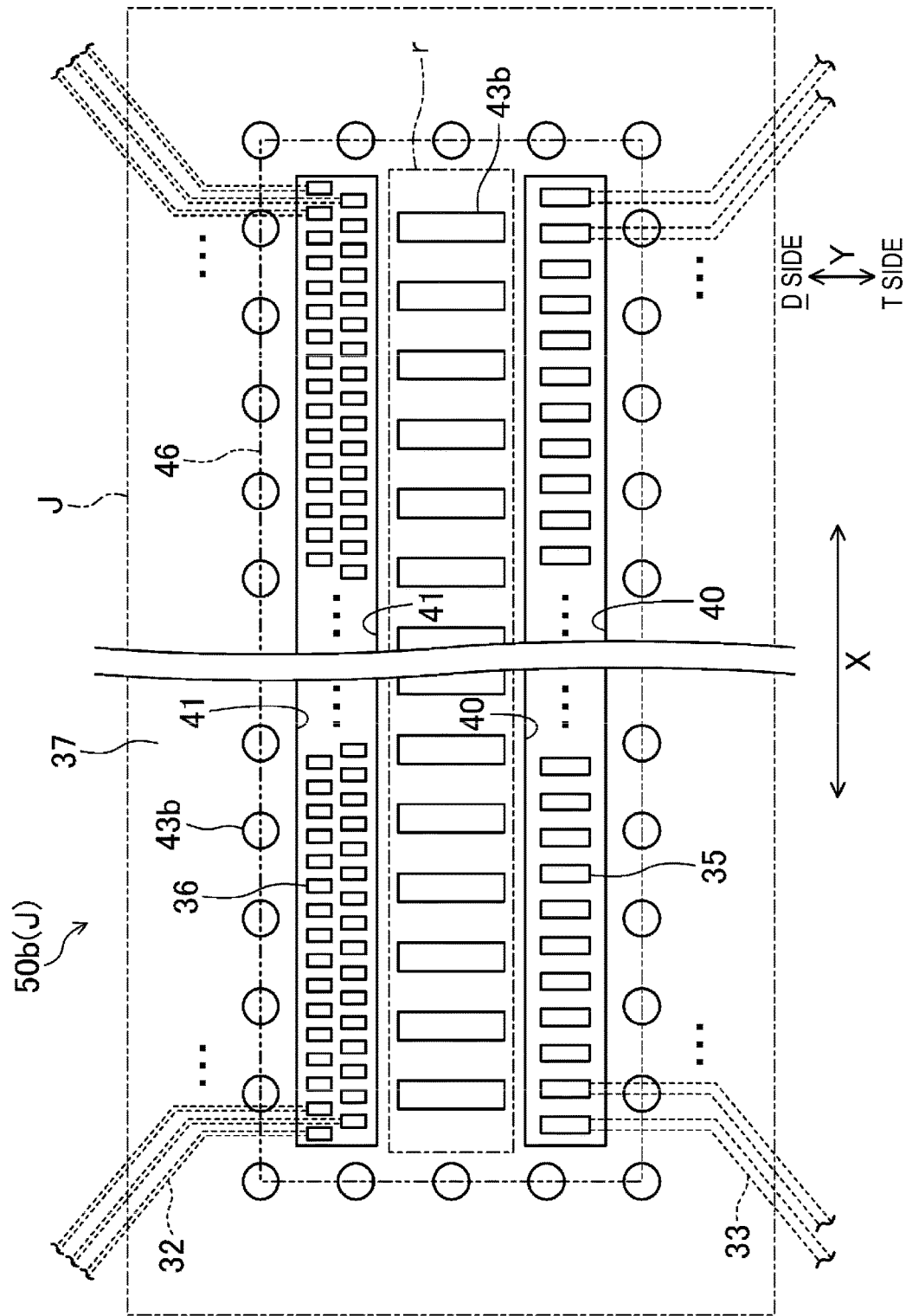
FIG. 13 is a plan view illustrating the terminal connection portion of the frame region of an organic EL display device according to a second embodiment of the disclosure, and is a view corresponding to FIG. 8.

Next, a second embodiment of the disclosure will be described. FIG. 13 is a plan view illustrating the terminal connection portion J of the frame region F of an organic EL display device 50b according to the present embodiment, and is a view corresponding to FIG. 8. Note that, apart from the terminal connection portion J, since an overall configuration of the organic EL display device 50b including the display region D, the frame region F, and the like is the same as that of the first embodiment described above, a detailed description thereof will be omitted. Note that constituent portions similar to those in the first embodiment described above are denoted by identical reference signs, and a description thereof will be omitted.

In the organic EL display device 50b, as illustrated in FIG. 13, a plurality of protruding portions 43b are each provided in an island shape (a column shape) in a plan view. Note that in FIG. 13, the IC 46 is illustrated in a simplified manner, and the bumps 47, 48 of the IC 46 are omitted.

In other words, the protruding portion 43b is a columnar body having one of a rectangular shape, a polygonal shape, a circular shape, an elliptical shape, and a diamond shape in a plan view, or having a shape obtained by combining these shapes. As a result, fluidity (hereinafter referred to as "resin fluidity") of a thermosetting resin 49b of the ACF 49 when compression-bonding the IC 46 to the terminal connection portion J is improved. As a result, the mechanical connectivity between the bumps 47, 48 or the terminal electrodes 35, 36, and the conductive particles 49a is maintained.

Note that the size, shape, number, position, and the like of the protruding portions 43b are not particularly limited, and they may be determined so that the warping of the resin substrate layer 10 and the film layer 60 when compression-bonding the IC 46 to the terminal connection portion J is reduced. For example, the shape of the protruding portions 43b along the end portion of the IC 46, and the shape of the protruding portions 43b corresponding to the central portion of the IC 46 may be the same or different from each other. Further, the protruding portions 43b may be positioned at equal intervals or randomly. Note that when the shape of the protruding portion 43b is a rectangular shape, from the perspective of improving the resin fluidity of the ACF 49 when compression-bonding the IC 46 to the terminal connection portion J, at positions corresponding to the central portion of the IC 46, the protruding portions 43b are preferably disposed so as to extend in a direction (the direction Y in FIG. 13) in which the bumps 47, 48 are disposed via the inter-electrode region r.

Further, as illustrated in FIG. 13, the protruding portions 43b are disposed corresponding to the outer peripheral portion and the central portion of the IC 46. Then, as illustrated in FIG. 13, in a plan view, the protruding portions 43b overlap with the IC 46 at the outer peripheral portion and the central portion of the IC 46, and overlap with the bumps 47, 48 when viewed from a direction parallel to the substrate surface of the resin substrate layer 10.

More specifically, the protruding portions 43b overlap with the bumps 47, 48 when viewed from a direction parallel to the direction X, a direction parallel to the direction Y, and a direction parallel to a direction inclined with respect to the direction X and the direction Y.

Here, when each of the protruding portions 43b is an independent columnar body, the protruding portion 43b may be formed not only of an organic insulating film as a single layer film or a layered film, but also, for example, of an inorganic insulating film or a metal layer as a single layer film or a layered film (more specifically, of the same material as and in the same layer as the first electrode 21), or of a layered material obtained by combining the organic insulating film, inorganic insulating film, and metal material. This is because if each of the protruding portions 43b is an independent columnar body, cracks are unlikely to occur in the protruding portion 43b, even when the resin substrate layer 10 and the film layer 60 are warped when compression-bonding the IC 46 to the terminal connection portion J.

In the method for manufacturing the organic EL display device 50a of the first embodiment described above, by changing the pattern shape of the protruding portion 43a, the organic EL display device 50b can be manufactured.

According to the organic EL display device 50b described above, the following effects can be obtained in addition to the above-described effects (1) to (5).

(6) Since the plurality of protruding portions 43b are each provided in an island shape in a plan view, the resin fluidity of the ACF 49 is improved when compression-bonding the IC 46 to the terminal connection portion J. As a result, the warping of the resin substrate layer 10 and the film layer 60 when compression-bonding the IC 46 to the terminal connection portion J is further reduced.

(7) Since the mechanical connectivity between the conductive particles 49a, and the bumps 47, 48 or the terminal electrodes 35, 36 is maintained, the deterioration in the electrical connectivity is suppressed.

Third Embodiment

Figure 14:
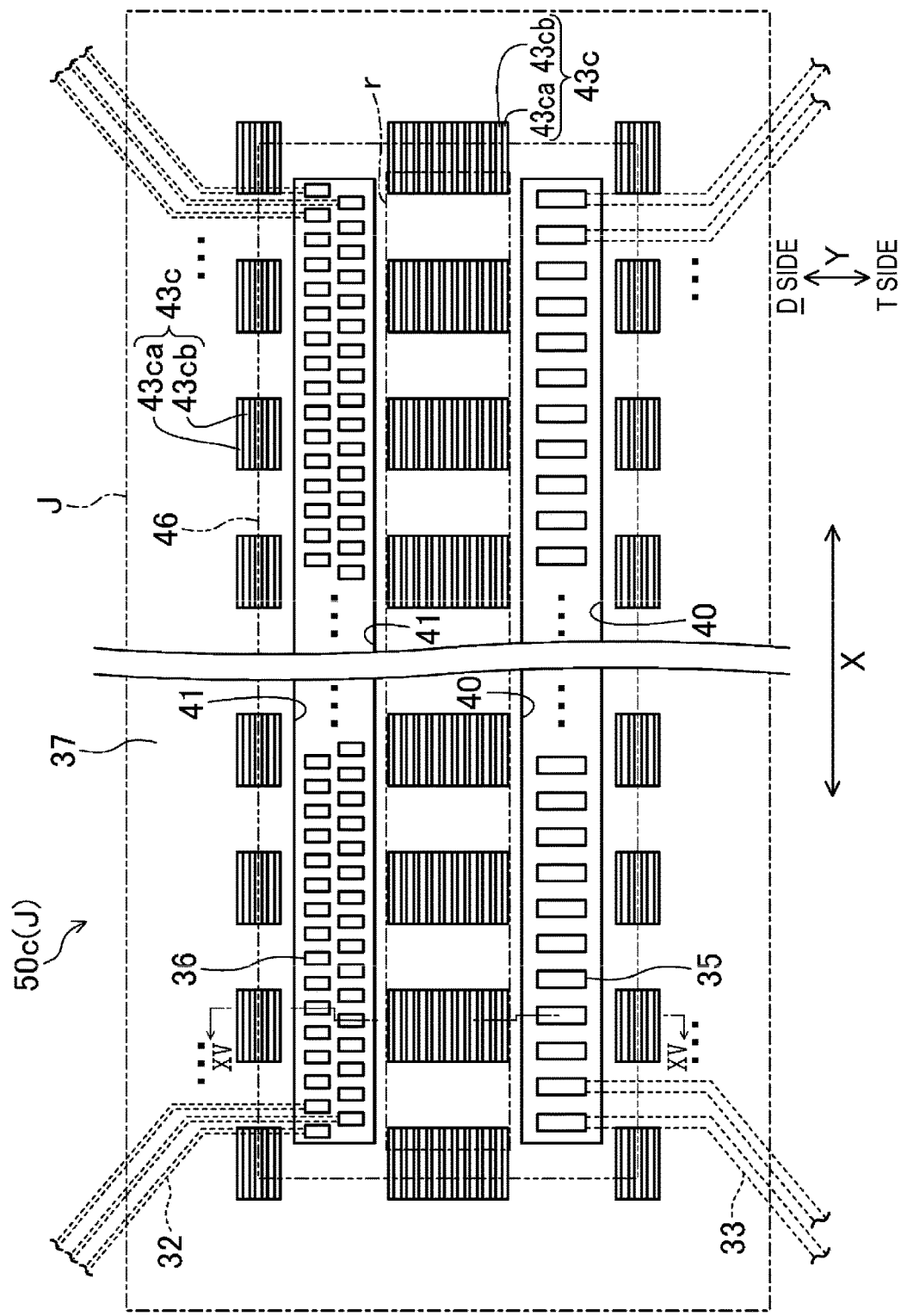
FIG. 14 is a plan view illustrating the terminal connection portion of the frame region of an organic EL display device according to a third embodiment of the disclosure, and is a view corresponding to FIG. 8.

Next, a third embodiment of the disclosure will be described. FIG. 14 is a plan view illustrating the terminal connection portion J of the frame region F of an organic EL display device 50c according to the present embodiment, and is a view corresponding to FIG. 8. Further, FIG. 15 is an enlarged cross-sectional view, taken along a line XV-XV in FIG. 14, illustrating the terminal connection portion J of the frame region F of the organic EL display device 50c, and is a view corresponding to FIG. 9.

Note that apart from the terminal connection portion J, since an overall configuration of the organic EL display device 50c including the display region D, the frame region F, and the like is the same as that of the first embodiment described above, a detailed description thereof will be omitted. Note that constituent portions similar to those in the first embodiment described above are denoted by identical reference signs, and a description thereof will be omitted.

Figure 15:
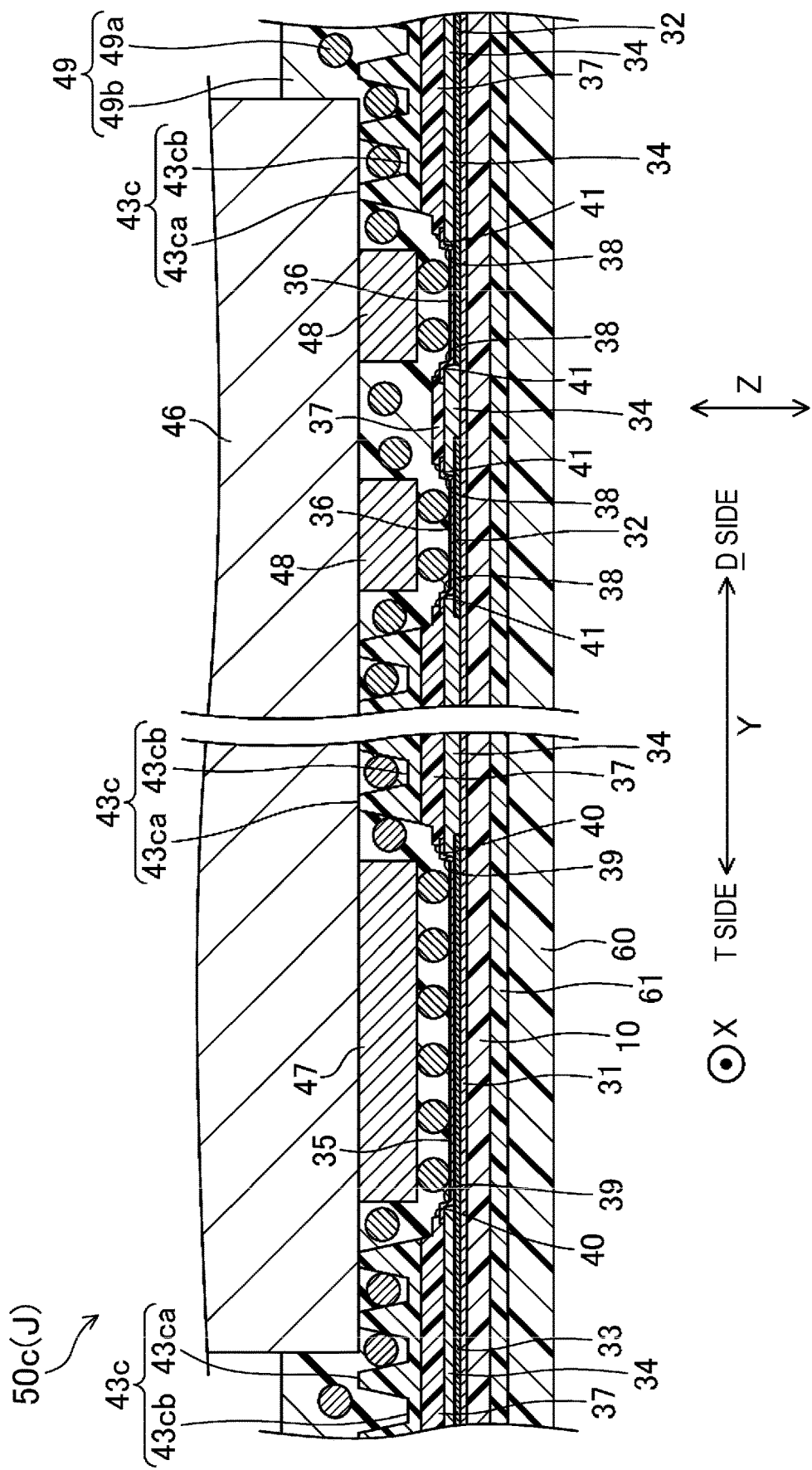
FIG. 15 is an enlarged cross-sectional view, taken along a line XV-XV in FIG. 14, illustrating the terminal connection portion of the frame region of the organic EL display device according to the third embodiment of the disclosure, and is a view corresponding to FIG. 9.

In the organic EL display device 50c, as illustrated in FIG. 14 and FIG. 15, a plurality of protruding portions 43c are each provided in an island shape in a plan view in a similar manner as in the second embodiment described above. Then, the protruding portion 43c is characterized by including a plurality (four in FIG. 14 and FIG. 15) of protrusions 43ca each having an upper surface in contact with the surface of the IC 46, and a plurality (three in FIG. 14 and FIG. 15) of grooves 43cb provided between two of the protrusions adjacent to each other. Note that in FIG. 14, the IC 46 is illustrated in a simplified manner, and the bumps 47, 48 of the IC 46 are omitted.

As illustrated in FIG. 14, the protrusions 43ca and the grooves 43cb are provided along the direction (the direction X) in which the terminal connection portion J extends.

Further, as illustrated in FIG. 15, since the protrusions (top portions) 43ca are directly in contact with the bottom surface portion, at the outer peripheral portion and the central portion, of the IC 46, the warping of the resin substrate layer 10 and the film layer 60 when compression-bonding the IC 46 to the terminal connection portion J is reduced. Note that since the protruding portion 43c is constituted by an organic insulating film as a single layer film or a layered film and has flexibility, even when the protruding portion 43ca comes into contact with the bottom surface of the IC 46 when compression-bonding the IC 46 to the terminal connection portion J, residual stress can be absorbed, and the stress is thus reduced.

Here, a dimension of the groove 43cb (a separation distance (pitch) between the two adjacent protrusions 43ca) is greater than the particle size of the conductive particles 49a. As a result, when the IC 46 is compression-bonded to the terminal connection portion J, the conductive particles 49a can flow into the grooves 43cb.

Note that the direction, size, shape, number, position, and the like of the protrusions 43ca and the grooves 43cb are not particularly limited, and they may be determined so that the warping of the resin substrate layer 10 and the film layer 60 when compression-bonding the IC 46 to the terminal connection portion J is reduced. For example, the direction of the protrusions 43ca and the grooves 43cb is not limited to the direction X, but may be a direction parallel to the substrate surface of the resin substrate layer 10. Further, the direction or the pitch of the protrusions 43ca and the grooves 43cb may be changed for each of the positions at which the protruding portions 43c are disposed. Further, it is sufficient that the shape of the grooves 43cb be structured so that the conductive particles 49a flow into the grooves 43cb when compression-bonding the IC 46 to the terminal connection portion J, and the grooves 43cb may be, for example, lattice-shaped grooves.

Further, as illustrated in FIG. 14, the protruding portions 43c are disposed corresponding to the outer peripheral portion and the central portion of the IC 46. Then, as illustrated in FIG. 14 and FIG. 15, in a plan view, the protruding portions 43c overlap with the IC 46 in the outer peripheral portion and the central portion of the IC 46, and overlap with the bumps 47, 48 when viewed from a direction parallel to the substrate surface of the resin substrate layer 10.

More specifically, the protruding portions 43c overlap with the bumps 47, 48 when viewed from a direction parallel to the direction Y, and a direction parallel to a direction inclined with respect to the direction X and the direction Y. Note that when viewed from a direction parallel to the direction X, the protruding portions 43c do not overlap with the bumps 47, 48, but the protruding portions 43c may overlap with the bumps 47, 48.

In the method for manufacturing the organic EL display device 50a of the first embodiment described above, by changing the pattern shape of the protruding portion 43a, the organic EL display device 50c can be manufactured.

According to the organic EL display device 50c described above, the following effects can be obtained in addition to the above-described effects (1) to (7).

(8) Since the plurality of protruding portions 43c are each provided in an island shape in a plan view, and each of the protruding portions 43c includes the protrusions 43ca directly in contact with the bottom surface of the IC 46 and the grooves 43cb each having the dimension greater than the particle size of the conductive particles 49a and provided between the adjacent protrusions 43ca, when the IC 46 is compression-bonded to the terminal connection portion J, the conductive particles 49a enter into the grooves 43cb, and also, the protrusions 43ca directly come into contact with the bottom surface of the IC 46. As a result, the warping of the resin substrate layer 10 and the film layer 60 when compression-bonding the IC 46 to the terminal connection portion J is reduced.

Fourth Embodiment

Figure 16:
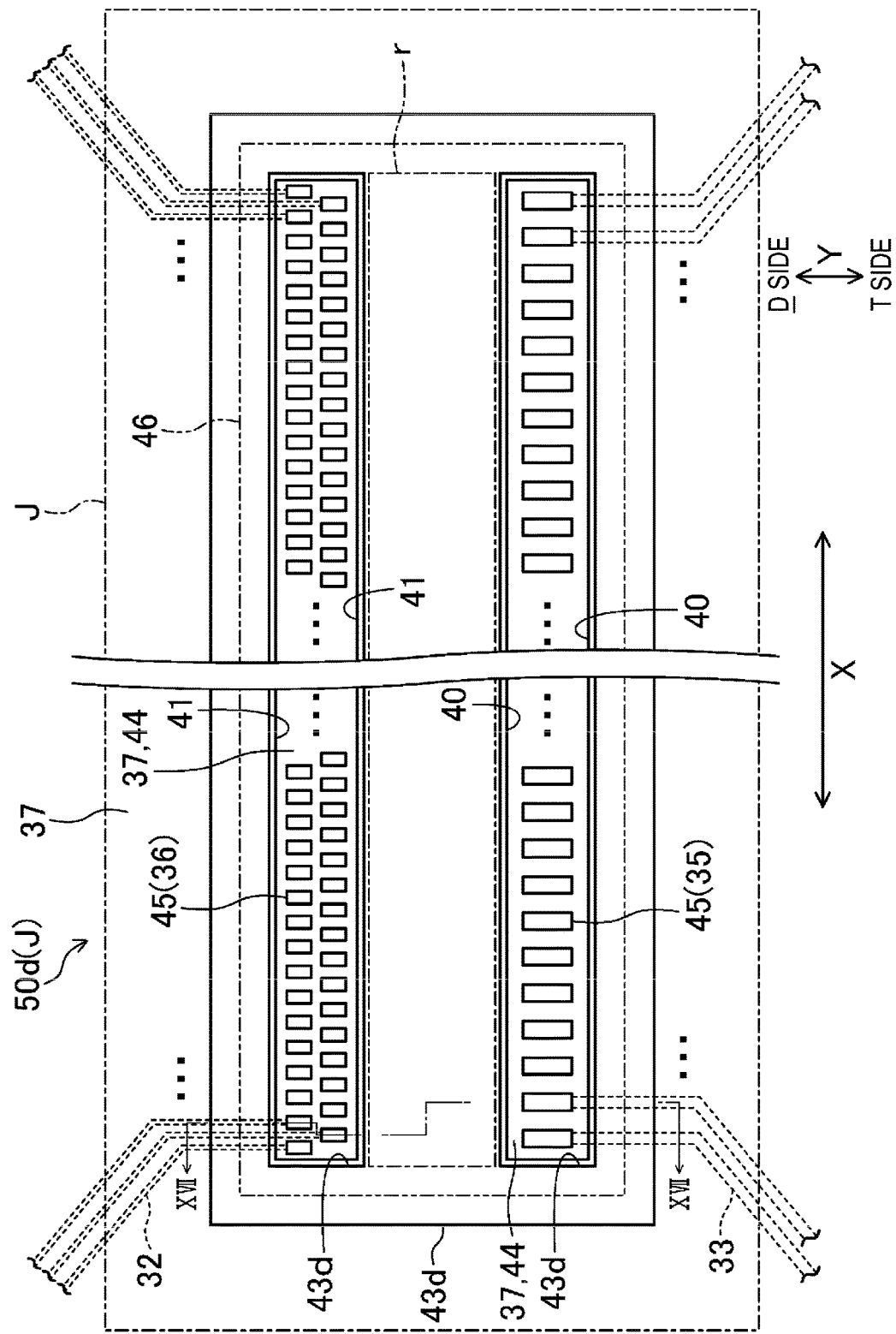
FIG. 16 is a plan view illustrating the terminal connection portion of the frame region of an organic EL display device according to a fourth embodiment of the disclosure, and is a view corresponding to FIG. 8.
Figure 17:
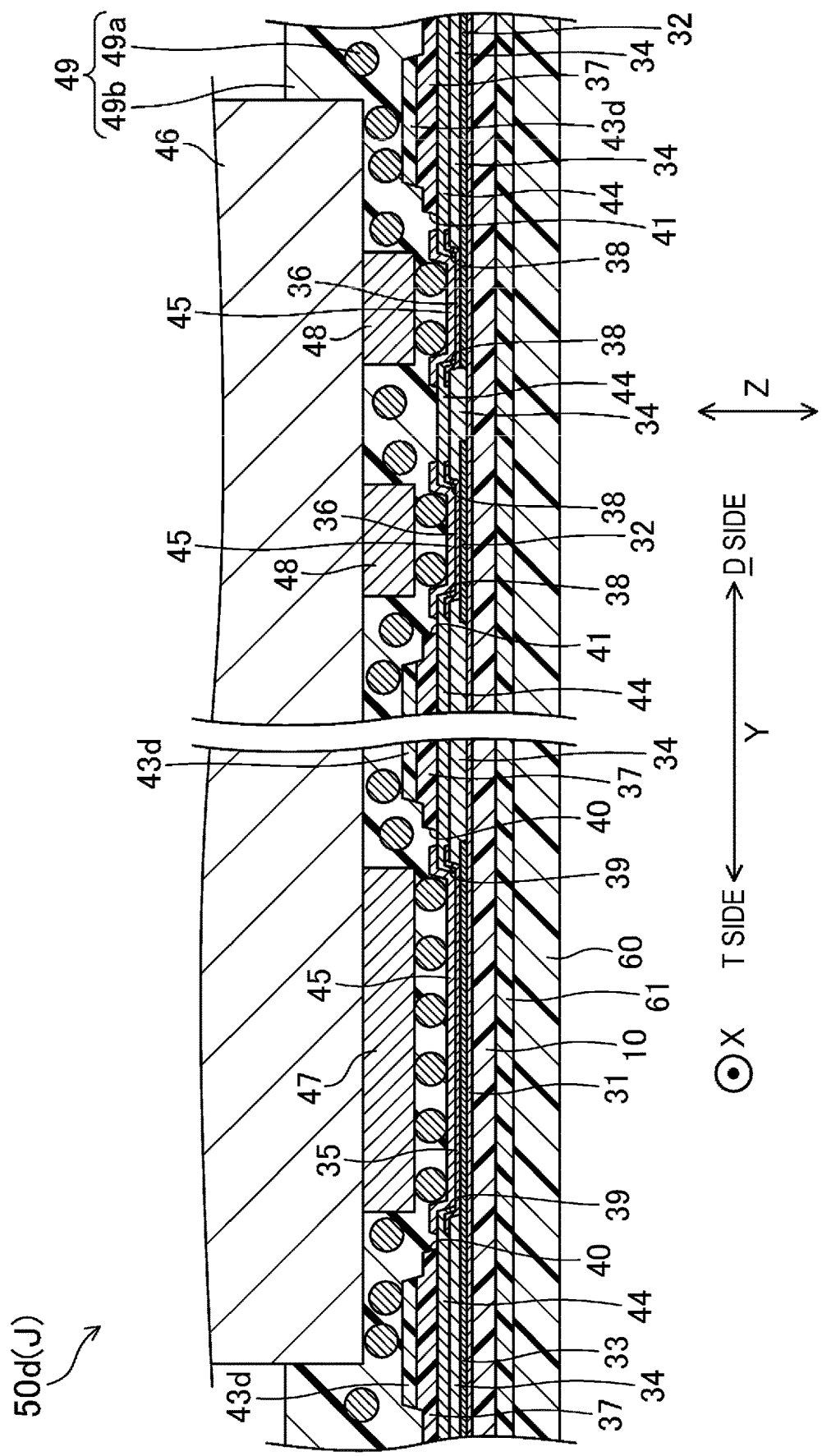
FIG. 17 is an enlarged cross-sectional view, taken along a line XVII-XVII in FIG. 16, illustrating the terminal connection portion of the frame region of the organic EL display device according to the fourth embodiment of the disclosure, and is a view corresponding to FIG. 9.

Next, a fourth embodiment of the disclosure will be described. FIG. 16 is a plan view illustrating the terminal connection portion J of the frame region F of an organic EL display device 50d according to the present embodiment, and is a view corresponding to FIG. 8. Further, FIG. 17 is an enlarged cross-sectional view, taken along a line XVII-XVII in FIG. 16, illustrating the terminal connection portion J of the frame region F of the organic EL display device 50d, and is a view corresponding to FIG. 9. Note that apart from the terminal connection portion J, since an overall configuration of the organic EL display device 50d including the display region D, the frame region F, and the like is the same as that of the first embodiment described above, a detailed description thereof will be omitted. Note that constituent portions similar to those in the first embodiment described above are denoted by the identical reference signs, and a description thereof will be omitted.

As illustrated in FIG. 16 and FIG. 17, the organic EL display device 50d further includes a third inorganic insulating film 44 provided between the second inorganic insulating film 34 and the electrode insulating film 37, and a transparent electrode 45 provided on the terminal electrodes 35, 36. Note that in FIG. 16, the IC 46 is illustrated in a simplified manner, and the bumps 47, 48 of the IC 46 are omitted.

As illustrated in FIG. 17, the third inorganic insulating film 44 is provided on the terminal electrodes 35, 36 and the second inorganic insulating film 34 so as to cover the peripheral portions of the terminal electrodes 35, 36. In other words, the third inorganic insulating film 44 serves as the edge cover and the flattening film of the terminal electrodes 35, 36. Note that the third inorganic insulating film 44 is formed by an inorganic insulating film as a single layer film or a layered film.

As illustrated in FIG. 17, the transparent electrode 45 is provided on the third inorganic insulating film 44 and the terminal electrodes 35, 36 so as to cover a peripheral portion of the third inorganic insulating film 44. This transparent electrode 45 is a protective film for preventing corrosion of the terminal electrodes 35, 36, and the like. Note that the transparent electrode 45 is formed of ITO, IZO, or the like, for example.

Further, in the organic EL display device 50d, as illustrated in FIG. 16, the electrode insulating film 37 and a protruding portion 43d are provided sequentially in this order on the third inorganic insulating film 44 so as to correspond to the outer peripheral portion and the central portion of the IC 46.

At the above-described terminal connection portion forming step in the method for manufacturing the organic EL display device 50a according to the first embodiment described above, the organic EL display device 50d may be manufactured after forming the terminal electrodes 35, 36 by forming the third inorganic insulating film 44, and then, forming the transparent electrode 45, the electrode insulating film 37, and the protruding portion 43d. Note that the thickness of the protruding portion 43d may be determined taking into account the thickness of the third inorganic insulating film 44.

Note that, in the organic EL display device 50d, as illustrated in FIG. 17, the electrode insulating film 37 is not disposed on the third inorganic insulating film 44 between the adjacent output bumps 48, but the electrode insulating film 37 may be disposed thereon. However, from the perspective of securing the resin fluidity of the ACF 49 when compression-bonding the IC 46 to the terminal connection portion J, it is preferable not to dispose the electrode insulating film 37 between the output bumps 48.

According to the organic EL display device 50d described above, the following effects can be obtained in addition to the above-described effects (1) to (5).

(9) Since the terminal electrodes 35, 36 are covered by the third inorganic insulating film 44 and the transparent electrode 45, the corrosion of the terminal electrodes 35, 36 and the like are suppressed. As a result, the degradation of the electrical characteristics and the environmental resistance performance of the organic EL display device 50d is further suppressed.

OTHER EMBODIMENTS

In each of the embodiments described above, the protruding portion is disposed corresponding to an outer edge portion and the central portion of the IC, but may be disposed along at least one of the outer edge portion and the central portion of the IC. Note that the protruding portion is preferably disposed at least along the outer edge portion of the IC.

In each of the embodiments described above, the protruding portion is disposed corresponding to the outer edge portion and the central portion of the IC, but the protruding portion is not limited thereto. For example, if there is an empty region between the adjacent output bumps or between the adjacent input bumps, the protruding portion may be provided on the resin substrate layer corresponding to that region in order to reduce the warping of the resin substrate layer corresponding to that region.

In each of the embodiments described above, the protruding portion may be formed by combining each of the protruding portions applied to the first to fourth embodiments described above. For example, in the first and fourth embodiments described above, the protruding portion corresponding to the central portion of the IC may be provided in a plurality, each being formed in an island in a plan view, in a similar manner as in the second or third embodiment. Further, in the second or third embodiment, the protruding portion along the outer edge portion of the IC may be provided in a frame shape in a plan view corresponding to the outer peripheral portion of the IC, in a similar manner as in the first or fourth embodiment.

In each of the embodiments described above, the electrode insulating film is constituted by an inorganic film as a single layer film or a layered film, but the electrode insulating film may be constituted by forming an edge cover of the input and output terminal electrodes using an inorganic insulating film, and forming, on the edge cover, a layered film obtained by layering an inorganic insulating film and an organic insulating film in the same layer using the same material as the edge cover.

In each of the second to fourth embodiments described above, the protruding portion may be configured by thickening the electrode insulating film without providing the protruding portion on the electrode insulating film, in a similar manner as in the first embodiment.

In each of the embodiments described above, the organic EL layer having a five-layered structure including the hole injection layer, the hole transport layer, the light-emitting layer, the electron transport layer, and the electron injection layer is exemplified, but the organic EL layer may have a three-layered structure including a hole injection-cum-transport layer, a light-emitting layer, and an electron transport-cum-injection layer, for example.

Further, in each of the embodiments described above, the organic EL display device including the first electrode as an anode electrode and the second electrode as a cathode electrode is exemplified, but the disclosure is also applicable to an organic EL display device in which the layered structure of the organic EL layer is reversed with the first electrode being a cathode electrode and the second electrode being an anode electrode.

Further, in each of the embodiments described above, the organic EL display device is exemplified and described as the display device, but the disclosure is not limited to the organic EL display device and is also applicable to any flexible display device. For example, the disclosure is applicable to a display device including quantum-dot light emitting diodes (QLEDs), which are light-emitting elements using a quantum dot-containing layer, or the like.

INDUSTRIAL APPLICABILITY

As described above, the disclosure is useful for a flexible display device.

The invention claimed is:
1. A display device comprising:
a display region provided with a plurality of pixels and a plurality of pixel circuits;
a frame region provided surrounding the display region;
a flexible substrate;
a thin film transistor layer provided on the flexible substrate and provided with a plurality of thin film transistors;
a plurality of light-emitting elements provided on the thin film transistor layer and including a plurality of first electrodes, a plurality of function layers, and a second electrode; and
a sealing layer provided to cover the plurality of light-emitting elements,
wherein the frame region is provided with
an electronic component including a plurality of input bumps to which signals are input and a plurality of output bumps from which signals are output, and
a terminal connection portion including a plurality of input terminal electrodes respectively electrically connected to the plurality of input bumps via an anisotropic conductive film and a plurality of output terminal electrodes respectively electrically connected to the plurality of output bumps,
an electrode insulating film is provided, in the terminal connection portion, on the plurality of input terminal electrodes and the plurality of output terminal electrodes, the electrode insulating film is provided with an input electrode opening configured to expose the plurality of input terminal electrodes and an output electrode opening configured to expose the plurality of output terminal electrodes, a protruding portion is provided on the electrode insulating film, the protruding portion overlaps the electronic component in a plan view, and overlaps the plurality of input bumps and the plurality of output bumps when viewed from a direction parallel to a substrate surface of the flexible substrate, and the protruding portion overlaps the electronic component in the plan view via the anisotropic conductive film.

2. The display device according to claim 1, wherein the protruding portion is further provided surrounding the input electrode opening.

3. The display device according to claim 1, wherein the protruding portion is further provided surrounding the output electrode opening.

4. The display device according to claim 1, wherein the protruding portion is further provided between the input electrode opening and the output electrode opening.

5. The display device according to claim 1, wherein the protruding portion further overlaps an end portion of the electronic component in the plan view.

6. The display device according to claim 1, wherein the protruding portion is further provided in a periphery of a region surrounding all the plurality of input bumps or all the plurality of output bumps.

7. The display device according to claim 1, wherein the protruding portion is in contact with a bottom surface of the electronic component.

8. The display device according to claim 1, wherein a plurality of protruding portions, including the protruding portion, is provided, such that each of the plurality of protruding portions is formed having an island shape in the plan view.

9. The display device according to claim 8, wherein each of the plurality of protruding portions overlaps an end portion of the electronic component in the plan view.

10. The display device according to claim 1, wherein the protruding portion is formed of an organic insulating film.

11. The display device according to claim 10, wherein the protruding portion is further formed of a same material and in a same layer as an edge cover.

12. The display device according to claim 1, wherein the protruding portion is formed of a layered material.

13. The display device according to claim 1, wherein an external terminal portion, in which a plurality of external terminal electrodes, to which signals are input from outside, is arrayed, is provided at an end portion of the frame region, and each of the plurality of external terminal electrodes is electrically connected to a corresponding one of the plurality of input terminal electrodes.

14. The display device according to claim 13, wherein a first inorganic insulating film, a plurality of first lead wiring lines and a plurality of second lead wiring lines, a second inorganic insulating film, and the plurality of input terminal electrodes and the plurality of output terminal electrodes are provided on the flexible substrate sequentially in this order when viewed from the flexible substrate, each of the plurality of first lead wiring lines is electrically connected to a corresponding one of the plurality of output terminal electrodes to input a signal to a corresponding one of the plurality of pixel circuits, and each of the plurality of external terminal electrodes and the corresponding one of the plurality of input terminal electrodes are electrically connected to each other via a corresponding one of the plurality of second lead wiring lines.

15. The display device according to claim 14, wherein a first wiring line opening configured to expose the plurality of first lead wiring lines is provided in the second inorganic insulating film, the first wiring line opening overlapping the plurality of output bumps in the plan view, and each of the plurality of first lead wiring lines and the corresponding one of the plurality of output terminal electrodes are in contact with each other in the first wiring line opening.

16. The display device according to claim 14, wherein a second wiring line opening configured to expose the plurality of second lead wiring lines is provided in the second inorganic insulating film, the second wiring line opening overlapping the plurality of input bumps in the plan view, and each of the plurality of second lead wiring lines and the corresponding one of the plurality of input terminal electrodes are in contact with each other in the second wiring line opening.

17. The display device according to claim 1, wherein an adhesive layer is provided at a back surface of the flexible substrate, and a film layer is provided via the adhesive layer.

18. A display device comprising:

a display region provided with a plurality of pixels and a plurality of pixel circuits;

a frame region provided surrounding the display region;

a flexible substrate;

a thin film transistor layer provided on the flexible substrate and provided with a plurality of thin film transistors;

a plurality of light-emitting elements provided on the thin film transistor layer and including a plurality of first electrodes, a plurality of function layers, and a second electrode; and a sealing layer provided to cover the plurality of light-emitting elements, wherein the frame region is provided with an electronic component including a plurality of input bumps to which signals are input and a plurality of output bumps from which signals are output, and a terminal connection portion including a plurality of input terminal electrodes respectively electrically connected to the plurality of input bumps via an anisotropic conductive film and a plurality of output terminal electrodes respectively electrically connected to the plurality of output bumps, an electrode insulating film is provided, in the terminal connection portion, on the plurality of input terminal electrodes and the plurality of output terminal electrodes, the electrode insulating film is provided with an input electrode opening configured to expose the plurality of input terminal electrodes and an output electrode opening configured to expose the plurality of output terminal electrodes, a protruding portion is provided on the electrode insulating film, the protruding portion overlaps the electronic component in a plan view, and overlaps the plurality of input bumps and the plurality of output bumps when viewed from a direction parallel to a substrate surface of the flexible substrate, and the protruding portion is formed of an inorganic insulating film.

19. A display device comprising:

a display region provided with a plurality of pixels and a plurality of pixel circuits;

a frame region provided surrounding the display region;

a flexible substrate;

a thin film transistor layer provided on the flexible substrate and provided with a plurality of thin film transistors;

a plurality of light-emitting elements provided on the thin film transistor layer and including a plurality of first electrodes, a plurality of function layers, and a second electrode; and a sealing layer provided to cover the plurality of light-emitting elements, wherein the frame region is provided with an electronic component including a plurality of input bumps to which signals are input and a plurality of output bumps from which signals are output, and a terminal connection portion including a plurality of input terminal electrodes respectively electrically connected to the plurality of input bumps via an anisotropic conductive film and a plurality of output terminal electrodes respectively electrically connected to the plurality of output bumps, an electrode insulating film is provided, in the terminal connection portion, on the plurality of input terminal electrodes and the plurality of output terminal electrodes, the electrode insulating film is provided with an input electrode opening configured to expose the plurality of input terminal electrodes and an output electrode opening configured to expose the plurality of output terminal electrodes, a protruding portion is provided on the electrode insulating film, the protruding portion overlaps the electronic component in a plan view, and overlaps the plurality of input bumps and the plurality of output bumps when viewed from a direction parallel to a substrate surface of the flexible substrate, and wherein the protruding portion is formed of a metal material.

20. The display device according to claim 19, wherein the protruding portion is further formed of a same material and in a same layer as the plurality of first electrodes.

* * * * *